(12) United States Patent
Park et al.

(10) Patent No.: US 9,716,162 B2
(45) Date of Patent: Jul. 25, 2017

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Sangjine Park, Yongin-si (KR); Jae-Jik Baek, Seongnam-si (KR); Myunggeun Song, Yongin-si (KR); Boun Yoon, Seoul (KR); Sukhun Choi, Suwon-si (KR); Jeongnam Han, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/697,829

(22) Filed: Apr. 28, 2015

(65) Prior Publication Data
US 2016/0027901 A1    Jan. 28, 2016

(30) Foreign Application Priority Data
Jul. 28, 2014  (KR) .......................... 10-2014-0095943

(51) Int. Cl.
| H01L 29/66 | (2006.01) |
| H01L 29/78 | (2006.01) |
| H01L 29/49 | (2006.01) |

(52) U.S. Cl.
CPC .... *H01L 29/66795* (2013.01); *H01L 29/4983* (2013.01); *H01L 29/66545* (2013.01); *H01L 29/66636* (2013.01); *H01L 29/78* (2013.01); *H01L 29/785* (2013.01)

(58) Field of Classification Search
None
See application file for complete search history.

(56) References Cited

U.S. PATENT DOCUMENTS

| 7,985,643 | B2 | 7/2011 | Furukawa et al. |
| 8,183,139 | B2 | 5/2012 | Marxsen et al. |
| 8,436,404 | B2 | 5/2013 | Bohr et al. |
| 8,878,300 | B1 * | 11/2014 | Liu ........................ H01L 29/785 257/368 |
| 9,087,723 | B2 * | 7/2015 | Lee ........................ H01L 27/092 |
| 9,530,729 | B2 * | 12/2016 | Choi ................ H01L 27/10855 |
| 2011/0291196 | A1 * | 12/2011 | Wei ........................ H01L 29/785 257/365 |
| 2013/0093093 | A1 | 4/2013 | Lee |
| 2013/0187203 | A1 | 7/2013 | Xie et al. |
| 2013/0234253 | A1 | 9/2013 | Toh et al. |

(Continued)

FOREIGN PATENT DOCUMENTS

| JP | 2003-007817 A | 1/2003 |
| KR | 10-2004-0050518 A | 6/2004 |
| KR | 10-2008-0001883 A | 1/2008 |

*Primary Examiner* — William Coleman
*Assistant Examiner* — Kien Ly
(74) *Attorney, Agent, or Firm* — Harness, Dickey & Pierce, P.L.C.

(57) ABSTRACT

Provided is a semiconductor device including a substrate with an active pattern, a gate electrode crossing the active pattern, and a gate capping pattern on the gate electrode. The gate capping pattern may have a width larger than that of the gate electrode, and the gate capping pattern may include extended portions extending toward the substrate and at least partially covering both sidewalls of the gate electrode.

20 Claims, 21 Drawing Sheets

(56) References Cited

U.S. PATENT DOCUMENTS

| | | | |
|---|---|---|---|
| 2013/0264617 A1* | 10/2013 | Joshi | H01L 29/785 257/288 |
| 2013/0288468 A1* | 10/2013 | Chi | H01L 29/665 438/525 |
| 2013/0288471 A1* | 10/2013 | Chi | H01L 29/665 438/586 |
| 2014/0061799 A1 | 3/2014 | Fan et al. | |
| 2014/0124840 A1* | 5/2014 | Khakifirooz | H01L 29/66545 257/288 |
| 2014/0145246 A1* | 5/2014 | Ning | H01L 29/812 257/280 |
| 2014/0306291 A1* | 10/2014 | Alptekin | H01L 29/41725 257/369 |
| 2015/0021672 A1* | 1/2015 | Chuang | H01L 21/28088 257/288 |
| 2015/0091100 A1* | 4/2015 | Xie | H01L 21/76224 257/401 |
| 2015/0162190 A1* | 6/2015 | Posseme | H01L 21/02126 257/288 |
| 2015/0303281 A1* | 10/2015 | Fogel | H01L 29/665 257/288 |
| 2015/0340497 A1* | 11/2015 | Xie | H01L 29/7848 257/77 |
| 2016/0005731 A1* | 1/2016 | Chen | H01L 27/0629 257/300 |

\* cited by examiner

SEMICONDUCTOR DEVICE AND METHOD OF FABRICATING THE SAME

CROSS-REFERENCE TO RELATED APPLICATION

This U.S. non-provisional patent application claims priority under 35 U.S.C. §119 to Korean Patent Application No. 10-2014-0095943, filed on Jul. 28, 2014, in the Korean Intellectual Property Office, the entire contents of which are hereby incorporated by reference.

BACKGROUND OF THE INVENTION

1. Technical Field

Some example embodiments of the inventive concepts relate to a semiconductor device and/or a method of fabricating the same, and in particular, to a semiconductor device with a field effect transistor and/or a method of fabricating the same.

2. Discussion of Prior Art

Semiconductor devices are increasingly being used in consumer, commercial and other electronic devices. The semiconductor devices may be classified into a memory device for storing data, a logic device for processing data, and a hybrid device including both of memory and logic elements. To meet the increased demand for electronic devices with fast speed and/or low power consumption, it is necessary to realize semiconductor devices with high reliability, high performance, and/or multiple functions. To satisfy these technical requirements, complexity and/or integration density of semiconductor devices are being increased.

SUMMARY

Some example embodiments of the inventive concepts provide a semiconductor device, in which a field effect transistor with improved electric characteristics is provided.

Some other example embodiments of the inventive concepts provide a method of fabricating a semiconductor device, in which a field effect transistor with improved electric characteristics is provided.

According to some example embodiments of the inventive concepts, a semiconductor device may include a substrate with an active pattern, a gate electrode crossing the active pattern, and a gate capping pattern on the gate electrode. The gate capping pattern may have a width larger than that of the gate electrode, and the gate capping pattern may include extended portions extending toward the substrate and at least partially covering both sidewalls of the gate electrode.

In some example embodiments, the device may further include a gate dielectric layer interposed between the gate electrode and the substrate and epitaxial patterns provided on the active pattern at both sides of the gate electrode.

In some example embodiments, the device may further include contact plugs provided on the substrate at both sides of the gate electrode and connected to the epitaxial patterns, respectively. Each of the contact plugs may be in contact with at least a portion of the gate capping pattern.

In some example embodiments, the gate capping pattern may have a seam formed at an upper portion thereof.

In some example embodiments, the width of the gate capping pattern may increase in a direction away from the substrate.

In some example embodiments, the device may further include spacer structures provided on the both sidewalls of the gate electrode. The gate capping pattern may be provided to cover top surfaces of the spacer structures, and interfaces between the extended portions and the spacer structures may be positioned at a lower level than a top surface of the gate electrode.

In some example embodiments, at least one of the extended portions may have a bottom surface that is in direct contact with a top surface of the substrate.

In some example embodiments, the device may further include a gate dielectric layer interposed between the gate electrode and the substrate, and an active fin extending upward from a top surface of the active pattern. The gate electrode may be disposed to cross the active fin, and the gate dielectric layer may be disposed to extend along a bottom surface of the gate electrode and cover top and side surfaces of the active fin.

In some example embodiments, the active fin may be provided between the epitaxial patterns and below the gate electrode, and the gate electrode may include first portions facing both sidewalls of the active fin and a second portion provided on the active fin to connect the first portions to each other.

According to some example embodiments of the inventive concepts, a semiconductor device may include a conductive pattern on a substrate, an interlayered insulating layer surrounding the conductive pattern, and a capping pattern on the conductive pattern. The capping pattern may include extended portions extending toward the substrate and covering both sidewalls of the conductive pattern, the capping pattern may be in contact with the interlayered insulating layer, and the capping pattern may have a width increasing in a direction away from the substrate.

According to some example embodiments of the inventive concepts, a method of fabricating a semiconductor device may include forming a sacrificial gate pattern on a substrate, forming spacers on both sidewalls of the sacrificial gate pattern, forming a first interlayered insulating layer to cover sidewalls of the spacers and expose top surfaces of the spacers, replacing the sacrificial gate pattern with a preliminary gate electrode, recessing the preliminary gate electrode and the spacers to form a gate electrode and define a recessed region on the gate electrode, and forming a gate capping pattern to fill the recessed region and cover top and both side surfaces of the gate electrode.

In some example embodiments, the top surface of the gate electrode may be higher than a lowermost bottom surface of the recessed region.

In some example embodiments, the method may further include forming epitaxial patterns on the substrate at both sides of the sacrificial gate pattern.

In some example embodiments, the method may further include forming a second interlayered insulating layer on the first interlayered insulating layer to cover the gate capping pattern and forming contact plugs to penetrate the second and first interlayered insulating layers and be connected to the epitaxial patterns, respectively. Each of the contact plugs may be formed to be in contact with at least a portion of the gate capping pattern.

In some example embodiments, the forming of the gate capping pattern may include forming a gate capping insulating layer to conformally cover top and both side surfaces of the gate electrode and inner sidewalls of the recessed region, and performing a planarization process on the gate capping insulating layer to form the gate capping pattern, a top surface of the gate capping pattern being coplanar with a top surface of the first interlayered insulating layer.

In some example embodiments, the gate capping insulating layer may be formed using an atomic layer deposition process.

In some example embodiments, the recessing may include recessing a top portion of the preliminary gate electrode to form the gate electrode, and recessing the spacers to form spacer structures. The recessed region may be formed to expose both sidewalls of the gate electrode.

In some example embodiments, the recessing may be performed to expose a portion of a top surface of the substrate.

In some example embodiments, the recessing may include partially etching the first interlayered insulating layer in contact with the spacers, and the recessed region may be formed to have an inclined inner sidewall.

In some example embodiments, the recessed region may be formed to have a width increasing in a direction away from the substrate.

BRIEF DESCRIPTION OF THE DRAWINGS

Some example embodiments will be more clearly understood from the following brief description taken in conjunction with the accompanying drawings. The accompanying drawings represent non-limiting, example embodiments as described herein.

DETAILED DESCRIPTION

Figure 1:
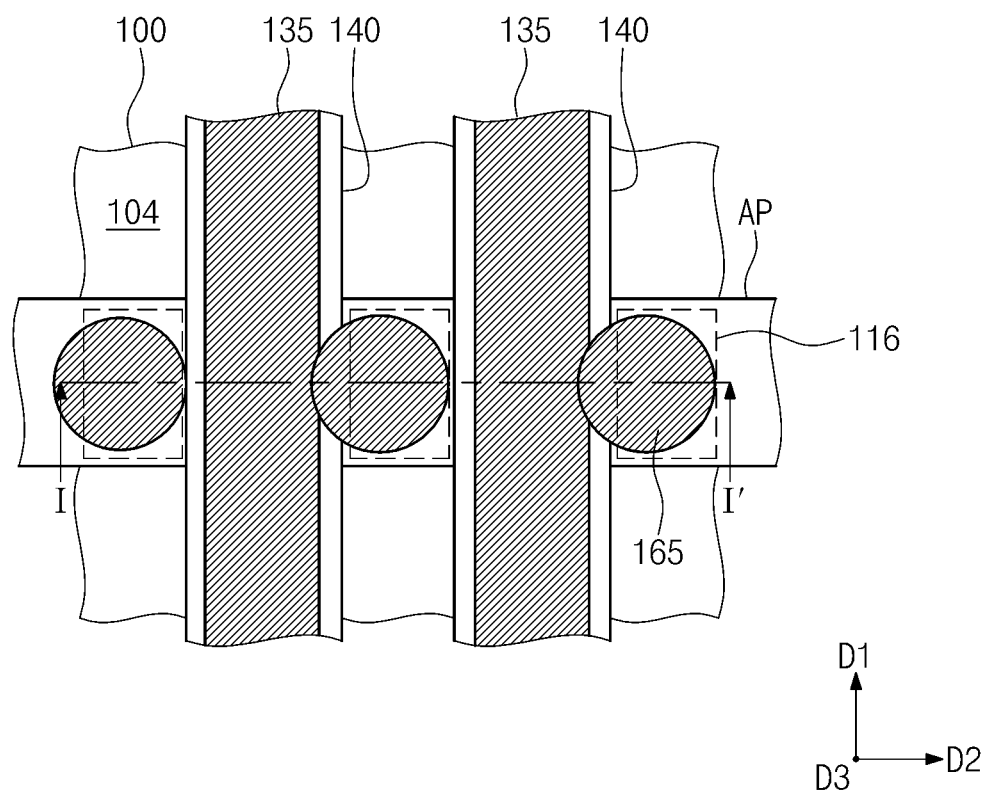
FIG. 1 is a plan view illustrating a semiconductor device according to some example embodiments of the inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
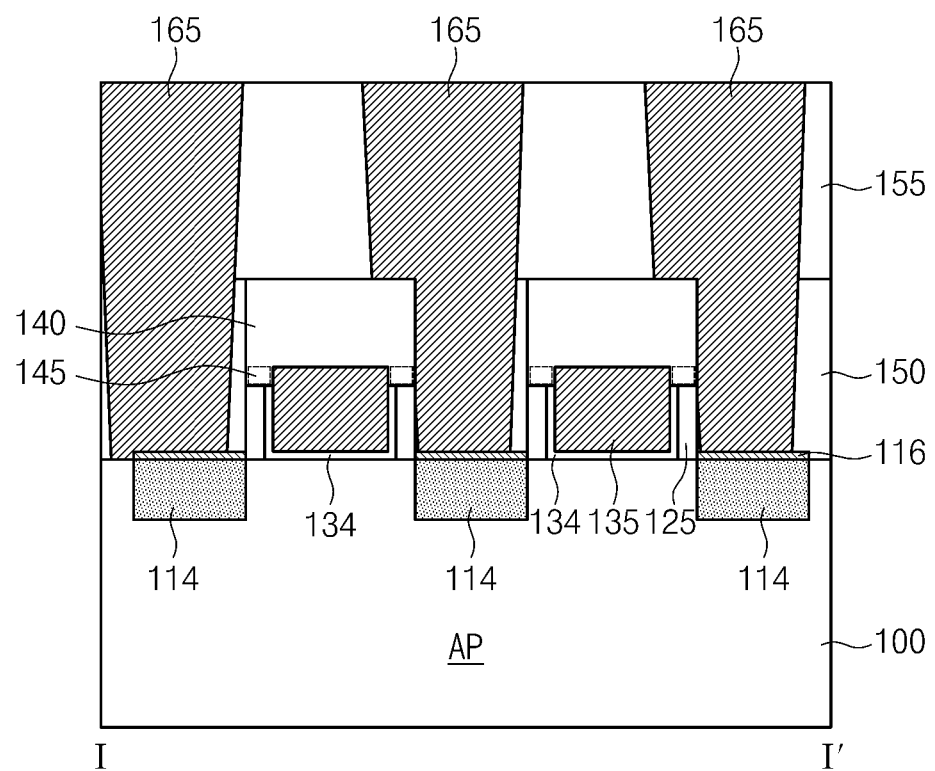
FIG. 2 is a sectional view taken along line I-I' of FIG. 1 to illustrate a semiconductor device according to some example embodiments of the inventive concepts.

FIG. 1 is a plan view illustrating a semiconductor device according to some example embodiments of the inventive concepts. FIG. 2 is a sectional view taken along line I-I' of FIG. 1 to illustrate a semiconductor device according to some example embodiments of the inventive concepts.

Referring to FIGS. 1 and 2, a substrate 100 may comprise a semiconductor substrate, which is made of at least one of silicon, germanium, silicon-germanium, or semiconductor compound. A device isolation pattern 104 may be provided in the substrate 100 to define an active pattern AP. The device isolation pattern 104 may comprise an insulating material (e.g., silicon oxide). The active pattern AP may be a portion of the substrate 100 delimited by the device isolation pattern 104. The active pattern AP may extend parallel to a top surface of the substrate 100 (for example, along a second direction D2) and may be shaped like a line or bar. Although one active pattern AP is illustrated, the substrate 100 may have a plurality of active patterns AP. In this case, the active patterns AP may be arranged along a first direction D1 crossing the second direction D2. The active pattern AP may have a first conductivity type.

Gate electrodes 135 may be provided on the substrate 100. In some example embodiments, the gate electrodes 135 may comprise a metallic material. For example, the gate electrodes 135 may comprise at least one of metal nitrides (e.g., titanium nitride or tantalum nitride) or metals (e.g., titanium, tantalum, tungsten, copper, or aluminum).

Each of the gate electrodes 135 may be a line- or bar-shaped structure crossing the active pattern AP and extending parallel to the first direction D1. A plurality of gate electrodes 135 may be provided to cross at least one of the active patterns AP. As an example, a pair of the gate electrodes 135 may be provided spaced apart from each other in the second direction D2, and each of them may be provided on each active pattern AP to extend parallel to the first direction D1. In an embodiment, a pair of the gate electrodes 135 are provided spaced apart from each other in the second direction D2 to cross one of the active patterns AP.

Spacer structures 125 may be provided on both sidewalls of each of the gate electrodes 135. The spacer structures 125 may extend along the gate electrodes 135 or parallel to the first direction D1. Each of the spacer structures 125 may have a top surface that is positioned below the top surfaces of the gate electrodes 135. The spacer structures 125 may comprise at least one of $SiO_2$, SiCN, SiCON, or SiN. Alternatively, each of the spacer structures 125 may be a multi-layered structure including at least one of $SiO_2$, SiCN, SiCON, or SiN.

Gate dielectric layers 134 may be provided between the gate electrodes 135 and the substrate 100 and between the gate electrodes 135 and the spacer structures 125. The gate dielectric layers 134 may comprise, for example, a high-k material. As an example, the gate dielectric layers 134 may comprise at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Gate capping patterns 140 may be disposed on the gate electrodes 135, respectively. The gate capping patterns 140 may extend along the gate electrodes 135 or parallel to the first direction D1. Each of the gate capping patterns 140 may have a width larger than that of each of the gate electrodes 135. Further, each of the gate capping patterns 140 may include a pair of extended portions 145 extending toward the substrate 100 and covering both sidewalls of the gate electrode 135. In other words, the extended portions 145 may be extended in an opposite direction of a third direction D3, which is orthogonal to both of the first and second directions D1 and D2 and is normal to the top surface of the substrate 100. In an embodiment, the gate capping patterns 140 may be provided to cover the whole top surface and both upper side surfaces of the gate electrodes 135, respectively. The extended portions 145 may have bottom surfaces, which are in contact with top surfaces of the spacer structures 125 and the gate dielectric layer 134. In certain embodiments, an interface between the extended portions 145 and the spacer structures 125 may be positioned below the top surface of the gate electrode 135.

The gate capping patterns 140 may include at least one of materials having an etch selectivity with respect to first and second interlayered dielectric (ILD) layers 150 and 155, which will be described below. In some example embodiments, the gate capping patterns 140 may include at least one of materials, whose dielectric constants are higher than those of the first and second ILD layers 150 and 155, in that, generally, an etch rate of a material decreases, as a dielectric constant thereof increases. As an example, the gate capping patterns 140 may comprise at least one of SiON, SiCN, SiCON, or SiN. The gate capping patterns 140 may be formed using a deposition process with a good step coverage property. For example, the gate capping patterns 140 may be formed using one of an atomic layer deposition (ALD) process, a plasma-enhanced chemical vapor deposition (PE-CVD) process, or a high-density plasma chemical vapor deposition (HDP-CVD) process.

According to some example embodiments of the inventive concepts, the gate capping patterns 140 may be provided to be thick enough to protect the gate electrodes 135 against etch damage, when contact plugs 165 are formed. For example, when an etching process is performed to form the contact plugs 165, the gate capping patterns 140, in place of the spacer structures 125, may protect top portions of the gate electrodes 135. Accordingly, it is possible to form the contact plugs 165 in a self-aligned manner, without any short circuit between the contact plugs 165 and the gate electrodes 135.

Epitaxial patterns 114 may be provided to be in contact with the active pattern AP between the gate electrodes 135. The epitaxial patterns 114 also may be provided on both sides of the gate electrodes 135. The epitaxial patterns 114 may serve as source/drain regions of a field effect transistor. Top surfaces of the epitaxial patterns 114 may be positioned at a level that is equivalent to or higher than that of the active pattern AP. In some example embodiments, as shown, the epitaxial patterns 114 may have a flat top surface, but in some other example embodiments, the epitaxial patterns 114 may be provided to have a curved top surface with a finite curvature. As an example, the epitaxial patterns 114 may be formed to have upward convex top surfaces. Although not shown, bottom surfaces of the epitaxial patterns 114 may be positioned above the bottom surface of the device isolation pattern 104.

The epitaxial patterns 114 may comprise a semiconductor material different from the substrate 100. For example, the epitaxial patterns 114 may comprise a semiconductor material having a lattice constant different from (for example, greater or smaller than) the substrate 100. Accordingly, the epitaxial patterns 114 may exert a compressive or tensile stress on a channel region, which is a portion of the active pattern AP positioned below the gate electrodes 135. As an example, the substrate 100 may be a silicon wafer, and the epitaxial patterns 114 may comprise embedded silicon-germanium (e-SiGe) or germanium. In an embodiment, a compressive stress may be exerted on the channel region, and the epitaxial patterns 114 may constitute PMOS field effect transistors. As another example, the substrate 100 may be a silicon wafer, and the epitaxial patterns 114 may comprise silicon carbide (SiC). In an embodiment, a tensile force may be exerted on a channel region, and the epitaxial patterns 114 may constitute NMOS field effect transistors. The compressive or tensile stress exerted on the channel region may make it possible to increase mobility of carriers in the channel region, when the field effect transistors are operated. The epitaxial patterns 114 may have a second conductivity type that is different from that of the active pattern AP.

The semiconductor capping patterns 116 may be provided on the epitaxial patterns 114, respectively. The semiconductor capping patterns 116 may include the same semiconductor element as the substrate 100 or the epitaxial patterns 114. As an example, the semiconductor capping patterns 116 may comprise silicon or silicon-germanium. As another example, each of the semiconductor capping patterns 116 may be a double-layered structure including a silicon layer and a silicon-germanium layer. In some example embodiments, the semiconductor capping patterns 116 may be doped with elements different from dopants contained in the epitaxial patterns 114. For example, in the case where the epitaxial patterns 114 contains an e-SiGe layer, the semiconductor capping patterns 116 may comprise a lightly Ge-doped layer and/or a highly B-doped layer. This makes it possible to reduce contact resistance between the semiconductor capping patterns 116 and the epitaxial patterns 114.

In an embodiment, a metal silicide layer may be further provided on each of the semiconductor capping patterns 116. The metal silicide layer may be formed by chemical reaction between semiconductor and metallic elements contained in the semiconductor capping patterns 116.

The first ILD layer 150 may be provided on the substrate 100. The first ILD layer 150 may have a top surface that is substantially coplanar with those of the gate capping patterns 140. The first ILD layer 150 may include a silicon oxide layer. The second ILD layer 155 may be provided on the first ILD layer 150 to cover the gate capping patterns 140. The second ILD layer 155 may comprise a silicon oxide layer or a low-k oxide layer. For example, the low-k oxide layer for the second ILD layer 155 may include a carbon-doped silicon oxide layer (e.g., SiCOH). In an embodiment, a pad oxide may be further disposed between the substrate 100 and the first ILD layer 150. The pad oxide may be formed of, for example, a silicon oxide layer.

The contact plugs 165 may be provided on the substrate 100 to penetrate the first and second ILD layers 150 and 155 and be in contact with the semiconductor capping patterns 116, respectively. At least one of the contact plugs 165 may be in direct contact with the gate capping pattern 140. However, due to the presence of the gate capping pattern 140, the contact plugs 165 may be electrically and spatially separate from the gate electrode 135.

In plan view, each of the contact plugs 165 may be aligned with a corresponding one of the semiconductor capping patterns 116 or the epitaxial patterns 114. Even in the case where the contact plugs 165 are slightly misaligned with respect to the semiconductor capping patterns 116 or the epitaxial patterns 114, the gate capping patterns 140 may allow the contact plugs 165 to be connected to the epitaxial patterns 114, without any contact with the gate electrodes 135. The contact plugs 165 may include a metallic material (e.g., tungsten). In some example embodiments, each of the contact plugs 165 may be a double-layered structure including a barrier metal layer (e.g., of a metal nitride) and a metal layer (e.g., of tungsten).

According to some example embodiments of the inventive concepts, the semiconductor device may include a field effect transistor with the gate electrode 135 and the gate capping pattern 140 stacked thereon. Here, the gate capping patterns 140 may be configured to protect a top portion of the gate electrode 135 from an etching process for forming a contact hole. For example, the gate capping pattern 140 may be formed of a material having a high etch selectivity with respect to the first and second ILD layers 150 and 155, and this makes it possible to effectively protect the gate electrodes 135 against etch damage, which may occur in the etching process for forming the contact hole. A process margin in the contact-hole etching process can be enlarged according to an embodiment. Accordingly, it is possible to provide a semiconductor device with improved electric characteristics and a method of fabricating the same with an enlarged process margin.

FIGS. 3A through 3K are sectional views illustrating a method of fabricating a semiconductor device, according to some example embodiments of the inventive concepts. In detail, each of FIG. 3A through 3K is a sectional view taken along line I-I' of FIG. 1.

Figure 3A:
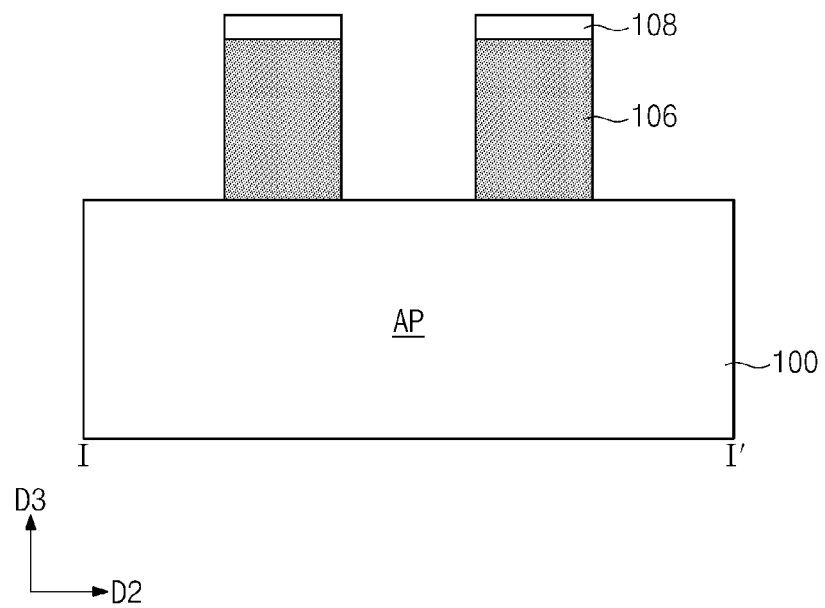
FIGS. 3A through 3K are sectional views illustrating a method of fabricating a semiconductor device, according to some example embodiments of the inventive concepts.

Referring to FIGS. 1 and 3A, sacrificial gate patterns 106 and gate mask patterns 108 may be sequentially formed on the substrate 100.

The substrate 100 may comprise a semiconductor substrate, which is made of at least one of silicon, germanium, silicon-germanium, or semiconductor compound. The device isolation pattern 104 may be formed in the substrate 100 to define the active pattern AP. The device isolation pattern 104 may be formed using a shallow trench isolation (STI) process. For example, the formation of the device isolation pattern 104 may include patterning the substrate 100 to form a trench and filling the trench with an insulating layer (e.g., of silicon oxide).

The active pattern AP may be a portion of the substrate 100 delimited by the device isolation pattern 104. The active pattern AP may extend parallel to the top surface of the substrate 100 or along the second direction D2 and may be shaped like a line or bar. Although one active pattern AP is illustrated, the substrate 100 may have a plurality of active patterns AP. In this case, the active patterns AP may be arranged along the first direction D1 or to cross the second direction D2. The active pattern AP may be doped to have the first conductivity type.

Each of the sacrificial gate patterns 106 and the gate mask patterns 108 may be a line- or bar-shaped structure crossing the active pattern AP and extending parallel to the first direction D1. For example, the sacrificial gate patterns 106 and the gate mask patterns 108 may be formed by sequentially forming a sacrificial gate layer and a gate mask layer on the substrate 100 and patterning the sacrificial gate layer and the gate mask layer.

The sacrificial gate patterns 106 may be formed to cross at least one of the active patterns AP. As an example, a pair of the sacrificial gate patterns 106 may be formed spaced apart from each other in the second direction D2 and may extend parallel to the first direction D1 on the active pattern AP. The sacrificial gate layer may comprise a poly-silicon layer. The gate mask layer may comprise a silicon nitride layer or a silicon oxynitride layer.

Although not shown, a pad oxide may be formed on the substrate 100, before the formation of the sacrificial gate layer. The pad oxide may be formed using a dry oxidation process, a wet oxidation process, or a radical oxidation process. For the sake of simplicity, the description that follows will refer to an example in which a pair of sacrificial gate patterns 106 are formed spaced apart from each other in the second direction D2 to cross one of the active patterns AP.

Figure 3B:
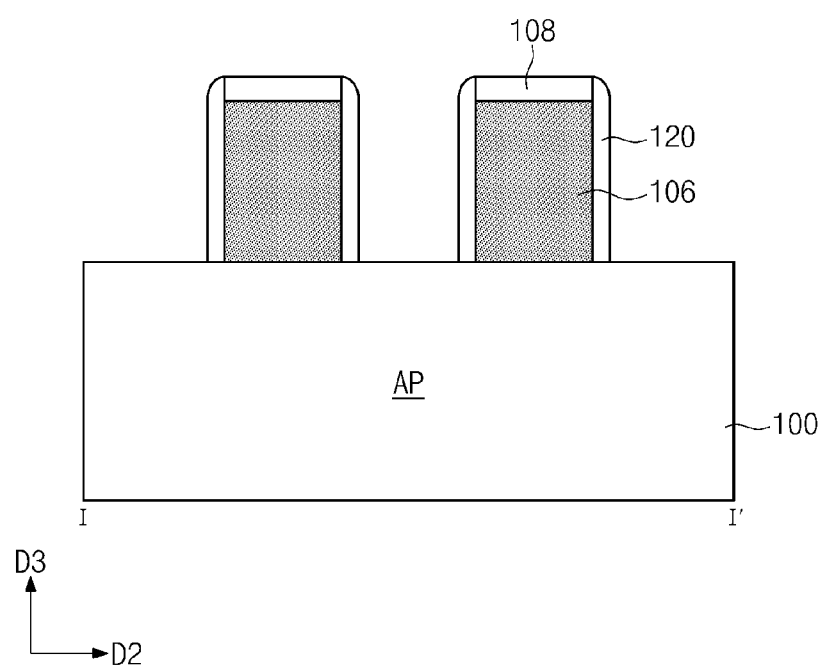

Referring to FIGS. 1 and 3B, spacers 120 may be formed on both sidewalls of the sacrificial gate patterns 106. The formation of the spacers 120 may include conformally forming a spacer layer on the substrate 100 provided with the sacrificial gate patterns 106, and then, performing an anisotropic etching process on the spacer layer. The spacers 120 may extend along the sacrificial gate patterns 106 or parallel to the first direction D1. The spacer layer may comprise at least one of $SiO_2$, SiCN, SiCON, or SiN. Alternatively, the spacer layer may be a multi-layered structure including at least one of $SiO_2$, SiCN, SiCON, or SiN.

Figure 3C:
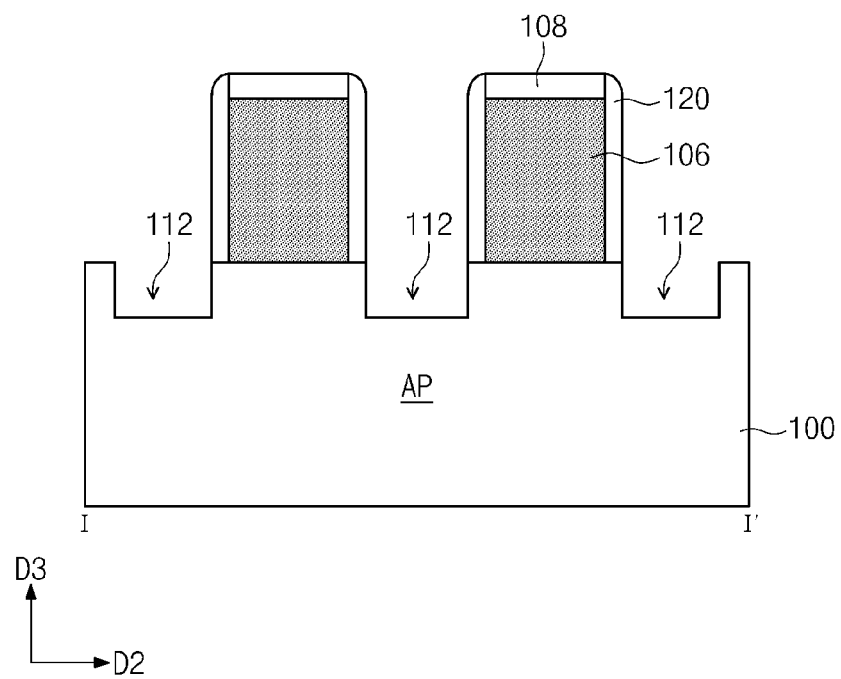

Referring to FIGS. 1 and 3C, first recessed regions 112 may be formed in the active pattern AP. The first recessed regions 112 may be formed by selectively etching the active pattern AP using the gate mask patterns 108 and the spacers 120 as an etch mask. As a result, the first recessed regions 112 may be formed between the sacrificial gate patterns 106. The first recessed regions 112 may be formed in the portions of the active pattern AP, which are disposed both sides of the sacrificial gate patterns 106. In an embodiment, the first recessed regions 112 may be formed to have bottom surfaces positioned at a higher level than that of the device isolation pattern 104. In some example embodiments, the selective etching of the active pattern AP may include anisotropically etching the active pattern AP. In other embodiments, the selective etching of the active pattern AP may be isotropically performed using a wet etching process, and in an embodiment, the first recessed regions 112 may extend below the sacrificial gate patterns 106.

Figure 3D:
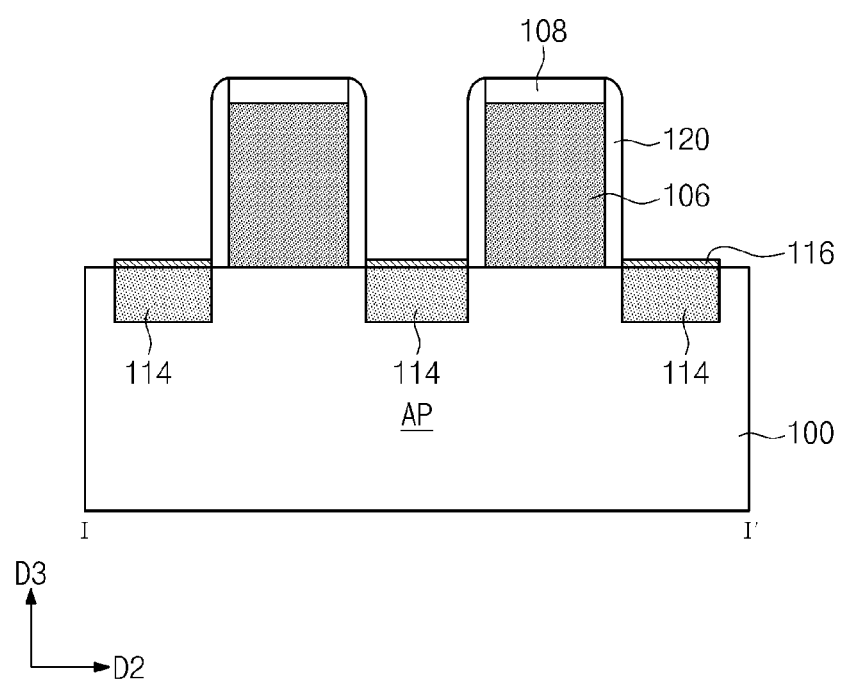

Referring to FIGS. 1 and 3D, the epitaxial patterns 114 may be formed in the first recessed regions 112, respectively. The epitaxial patterns 114 may be used as source/drain regions of a field effect transistor according to some example embodiments of the inventive concepts.

The epitaxial patterns 114 may be formed by a selective epitaxial growth process using the substrate 100 as a seed layer. The selective epitaxial growth process may include, for example, a chemical vapor deposition (CVD) process or a molecular beam epitaxy (MBE) process. Each of the epitaxial patterns 114 may be formed to completely fill a corresponding one of the recess regions 112. In some example embodiments, as shown, the epitaxial pattern 114 may be formed to have a top surface coplanar with that of the active pattern AP, but in other embodiments, the epitaxial patterns 114 may be formed to have a top surface positioned at a higher level than that of the active pattern AP. In an embodiment, the epitaxial patterns 114 may be provided to have a curved top surface with a finite curvature. As an example, the epitaxial patterns 114 may be formed to have upward convex top surfaces.

The epitaxial patterns 114 may comprise a semiconductor material different from the substrate 100. For example, the epitaxial patterns 114 may comprise a semiconductor material having a lattice constant different from (for example, greater or smaller than) the substrate 100. Accordingly, the epitaxial patterns 114 may exert a compressive or tensile stress on a channel region, which is a portion of the active pattern AP positioned below the sacrificial gate patterns 106. As an example, the substrate 100 may be a silicon wafer, and the epitaxial patterns 114 may comprise embedded silicon-germanium (e-SiGe) or germanium. In this case, a compressive force may be exerted on the channel region, and the epitaxial patterns 114 may constitute PMOS field effect transistors. As another example, the substrate 100 may be a silicon wafer, and the epitaxial patterns 114 may comprise silicon carbide (SiC). In this case, a tensile force may be exerted on the channel region, and the epitaxial patterns 114 may constitute NMOS field effect transistors. The compressive or tensile stress exerted on the channel region may make it possible to increase mobility of carriers in the channel region, when the field effect transistors are operated.

The epitaxial patterns 114 may be doped to have a different conductivity type from that of the active pattern AP or have a second conductivity type. In some example embodiments, the doping of the epitaxial patterns 114 may be performed in an in-situ manner, when the epitaxial patterns 114 are formed. In some other example embodiments, the doping of the epitaxial patterns 114 may be performed using an ion implantation process, after the formation of the epitaxial patterns 114.

Thereafter, the semiconductor capping patterns 116 may be formed on top surfaces of the epitaxial patterns 114, respectively. The semiconductor capping patterns 116 may comprise the same semiconductor element as the substrate 100 or the epitaxial patterns 114. For example, the semiconductor capping patterns 116 may comprise silicon or silicon-germanium. Alternatively, each of the semiconductor capping patterns 116 may be a double-layered structure including a silicon layer and a silicon-germanium layer. In some example embodiments, the semiconductor capping patterns 116 may be doped with elements different from dopants contained in the epitaxial patterns 114. For example, in the case where the epitaxial patterns 114 is formed of an e-SiGe layer, the semiconductor capping patterns 116 may be formed of a lightly Ge-doped layer and/or a highly B-doped layer. The B-doped layer may be formed by an ion implantation, plasma doping, or in-situ doping process. This makes it possible to reduce contact resistance between the semiconductor capping patterns 116 and the source/drain regions.

Although not shown, a metal silicide layer may be additionally formed on each of the semiconductor capping patterns 116. The metal silicide layer may be formed by chemical reaction between semiconductor and metallic elements contained in the semiconductor capping patterns 116.

Figure 3E:
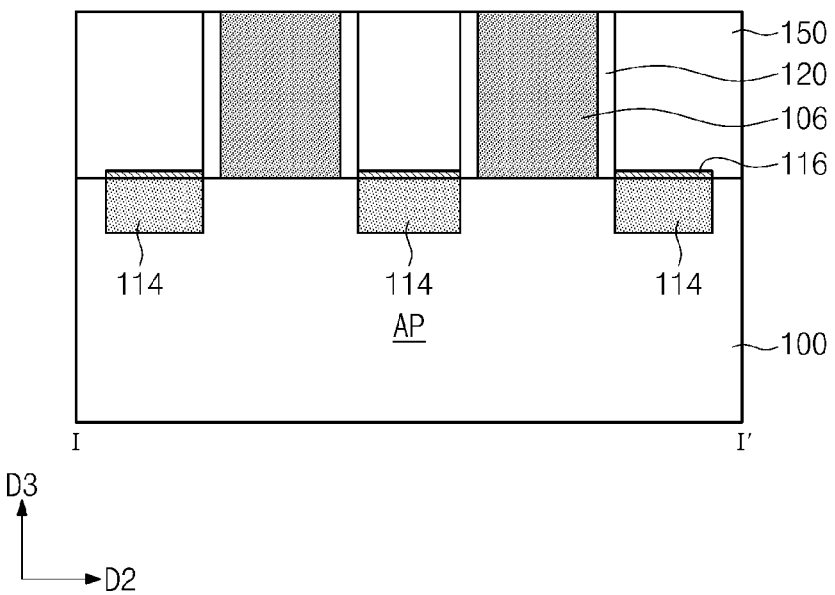

Referring to FIGS. 1 and 3E, the first ILD layer 150 may be formed on the structure provided with the semiconductor capping patterns 116. The formation of the first ILD layer 150 may include forming an insulating layer to cover the structure provided with the sacrificial gate patterns 106 and the gate mask patterns 108 and then planarizing the insulating layer to expose top surfaces of the sacrificial gate patterns 106.

The first ILD layer 150 may include a silicon oxide layer, which may be formed by, for example, a flowable chemical vapor deposition (FCVD) process. The planarization of the first ILD layer 150 may be performed using an etch-back or chemical mechanical polishing (CMP) process. As a result of the planarization process, the gate mask patterns 108 may be removed to expose the top surfaces of the sacrificial gate patterns 106. Further, the planarization process may be performed to remove upper portions of the spacers 120. Accordingly, after the planarization process, the first ILD layer 150 may have a top surface coplanar with the top surfaces of the sacrificial gate patterns 106 and the spacers 120.

Figure 3F:
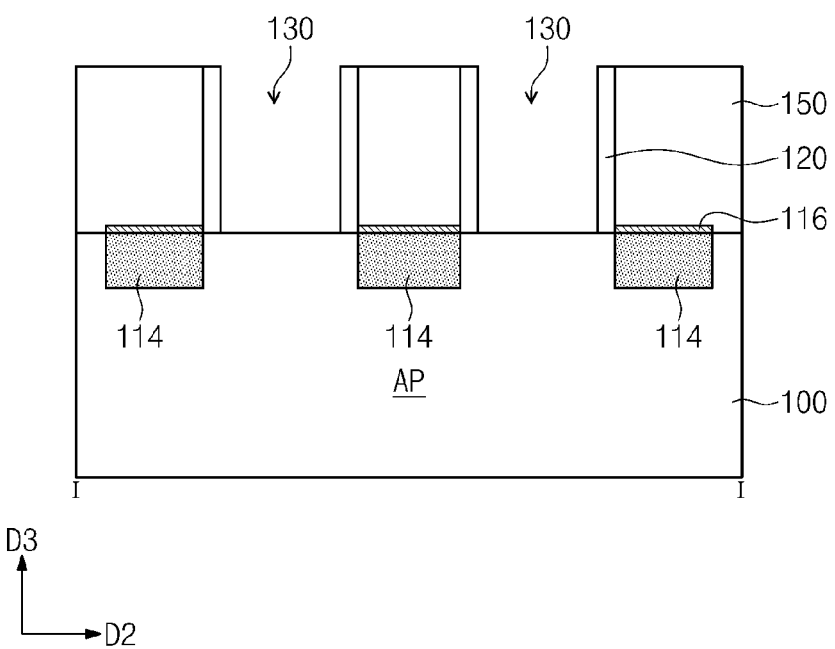

Referring to FIGS. 1 and 3F, the sacrificial gate patterns 106 may be removed to form gate trenches 130. The gate trenches 130 may be formed by selectively etching the sacrificial gate patterns 106. The gate trenches 130 may be formed to expose the top surface of the substrate 100 and extend parallel to the first direction D1.

Figure 3G:
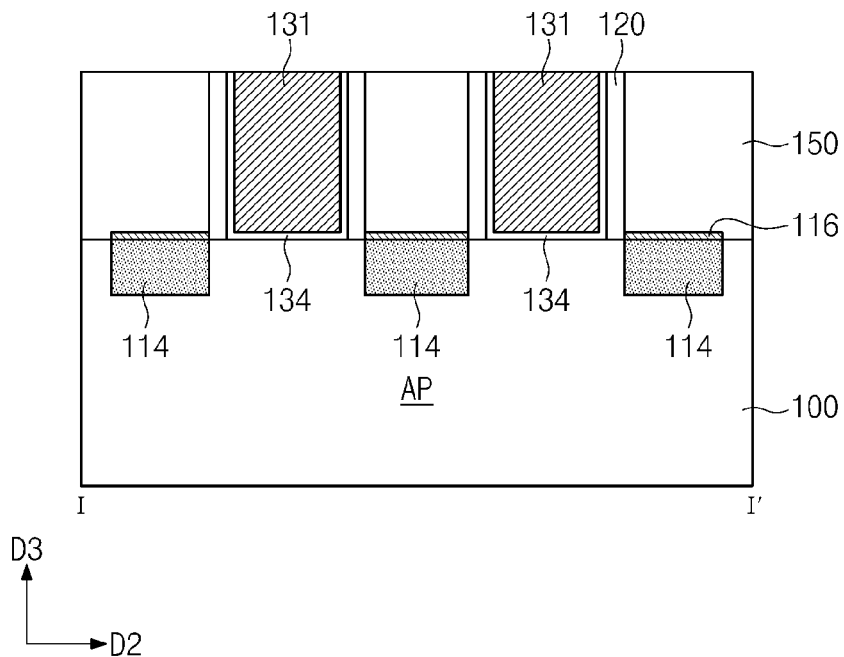

Referring to FIGS. 1 and 3G, the gate dielectric layer 134 and a preliminary gate electrode 131 may be formed in each of the gate trenches 130.

For example, the gate dielectric layer 134 may be formed to completely cover the structure provided with the gate trenches 130. The gate dielectric layer 134 may be conformally formed to have a thickness that is too small to completely fill the gate trenches 130. In other words, the gate dielectric layer 134 may be formed to cover bottom surfaces of the gate trenches 130, sidewalls of the spacers 120 exposed by the gate trenches 130, and the top surface of the first ILD layer 150. The gate dielectric layer 134 may be formed by an ALD process or a chemical oxidation process. In some example embodiments, the gate dielectric layer 134 may include a high-k material. For example, the gate dielectric layer 134 may comprise at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Thereafter, a gate electrode layer (not shown) may be formed to fill the gate trenches 130 provided with the gate dielectric layer 134, and then, the gate electrode layer and the gate dielectric layer 134 may be planarized to expose the top surface of the first ILD layer 150. Accordingly, the gate dielectric layer 134 and the preliminary gate electrode 131 may be locally formed in each of the gate trenches 130. The gate dielectric layer 134 and the preliminary gate electrode 131 may extend parallel to the first direction D1. In some example embodiments, the gate electrode layer may comprise at least one of conductive metal nitrides (e.g., titanium nitride or tantalum nitride) or metals (e.g., titanium, tantalum, tungsten, copper, or aluminum). The gate electrode layer may be formed by a deposition process (e.g., a CVD or sputtering process). The planarization of the gate electrode layer and the gate dielectric layer 134 may include a CMP process. As a result of the planarization process, the first ILD layer 150 may have a top surface coplanar with top surfaces of the preliminary gate electrodes 131 and the spacers 120.

Figure 3H:
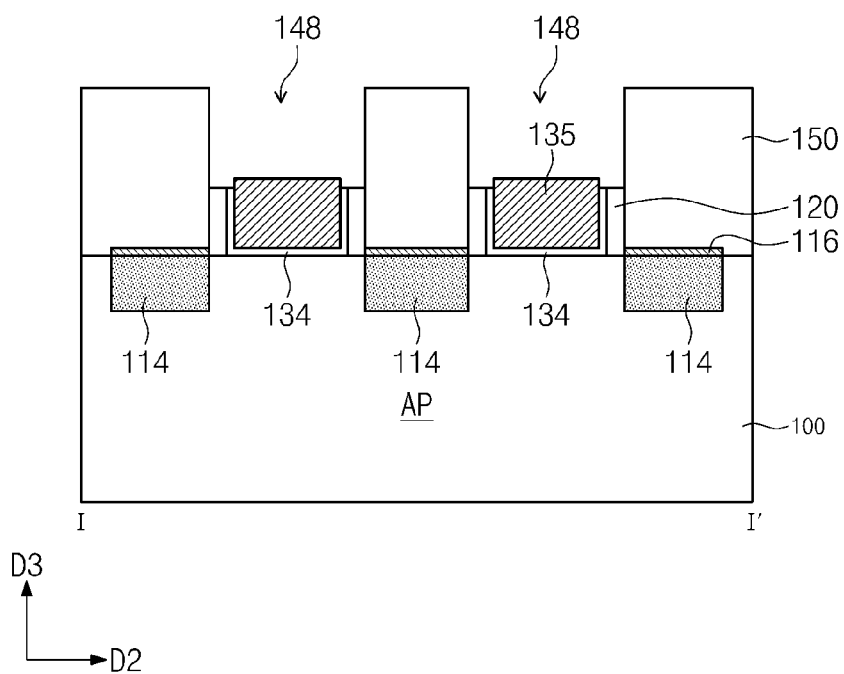

Referring to FIGS. 1 and 3H, the preliminary gate electrodes 131 may be downward recessed to form the gate electrodes 135. For example, the gate electrodes 135 may be formed by selectively etching upper portions of the preliminary gate electrodes 131. The etching process may be performed in such a way that top surfaces of the gate electrodes 135 are positioned at a lower level than that of the first ILD layer 150. In some example embodiments, after the formation of the gate electrodes 135, portions of the gate dielectric layer 134 exposed by the gate electrodes 135 may be removed. Accordingly, the gate dielectric layer 134 may be locally formed between the gate electrodes 135 and the substrate 100, and between the gate electrodes 135 and the spacers 120.

Next, the spacers 120 may be recessed to form the spacer structures 125 and define second recessed regions 148. The recessing of the spacers 120 may include etching top portions of the spacers 120 using at least one of dry or wet etching techniques. Each of the second recessed regions 148 may be formed to expose a top surface and both upper side surfaces of the gate electrodes 135, top surfaces of the spacer structures 125, and inner sidewalls of the first ILD layer 150.

Figure 3I:
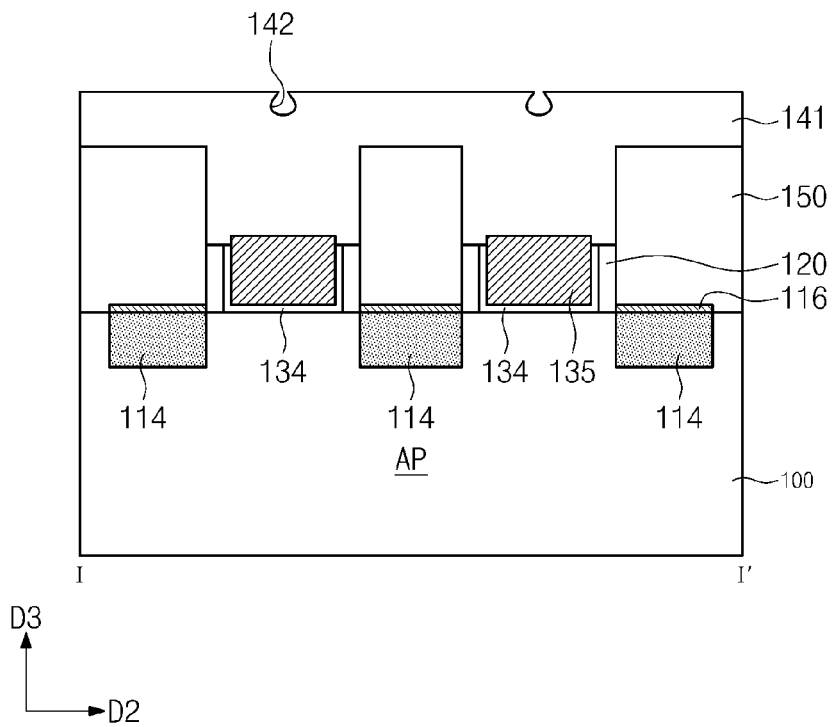

Referring to FIGS. 1 and 3I, a gate capping insulating layer 141 may be formed to cover the top surfaces of the gate electrodes 135. The gate capping insulating layer 141 may be formed to fill the second recessed regions 148 and cover the top surface of the first ILD layer 150. The gate capping insulating layer 141 may comprise a material having an etch selectivity with respect to not only the first ILD layer 150 but also the second ILD layer 155, which will be formed in a subsequent process. In some example embodiments, the gate capping insulating layer 141 may comprise at least one of SiON, SiCN, SiCON, or SiN.

The gate capping insulating layer 141 may be formed using, for example, a deposition process with a good step coverage property. For example, the gate capping insulating layer 141 may be formed using one of an atomic layer deposition (ALD) process, a plasma-enhanced chemical vapor deposition (PE-CVD) process, or a high-density plasma chemical vapor deposition (HDP-CVD) process.

By using the deposition process with the good step coverage property, the gate capping insulating layer 141 can be conformally formed to cover the second recessed regions 148. However, in certain embodiments, seams 142 may be formed in the gate capping insulating layer 141. Since the gate capping insulating layer 141 is conformally formed, a position and shape of each of the seams 142 may be dependent on a surface structure of a corresponding one of the second recessed regions 148. For example, the seams 142 may be formed at an upper portion of the gate capping insulating layer 141.

Figure 3J:
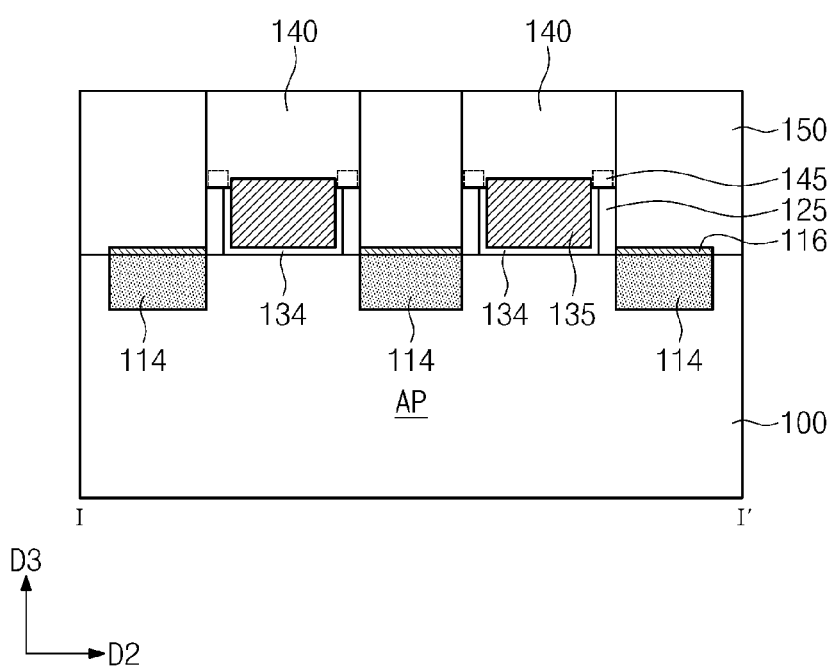

Referring to FIGS. 1 and 3J, a planarization process may be performed on the gate capping insulating layer 141 to form the gate capping patterns 140. The planarization process of the gate capping insulating layer 141 may include a CMP process. The planarization process may be performed to expose the top surface of the first ILD layer 150. For example, the gate capping patterns 140 may be formed to have top surfaces coplanar with that of the first ILD layer 150. In certain embodiments, the planarization process may be performed to remove the seams 142. The gate capping patterns 140 may be formed on the gate electrodes 135, respectively. For example, the gate capping patterns 140 may be formed to extend along the gate electrodes 135 or parallel to the first direction D1.

The gate capping pattern 140 may be formed to have a width larger than that of the gate electrode 135. Further, each of the gate capping patterns 140 may be formed to have the pair of the extended portions 145, which extend toward the substrate 100 and cover both sidewalls of the gate electrode 135. In other words, the gate capping patterns 140 may be formed to cover the whole top surface and both upper side surfaces of the gate electrodes 135, respectively.

The spacers 120 and the spacer structures 125 may be damaged in the steps of forming the first recessed regions 112, as shown in FIG. 3C, or doping the epitaxial patterns 114 with dopants, as shown in FIG. 3D. In this case, the spacers 120 and the spacer structures 125 may not have a sufficiently high etch selectivity with respect to the first and second ILD layers 150 and 155. According to the present embodiment, the gate capping patterns 140, in place of the spacers 120 and the spacer structures 125, may be used to protect the gate electrodes 135. That is, the use of the gate capping patterns 140 makes it possible to effectively form the contact plugs 165 in a self-aligned manner, in a subsequent process.

Figure 3K:
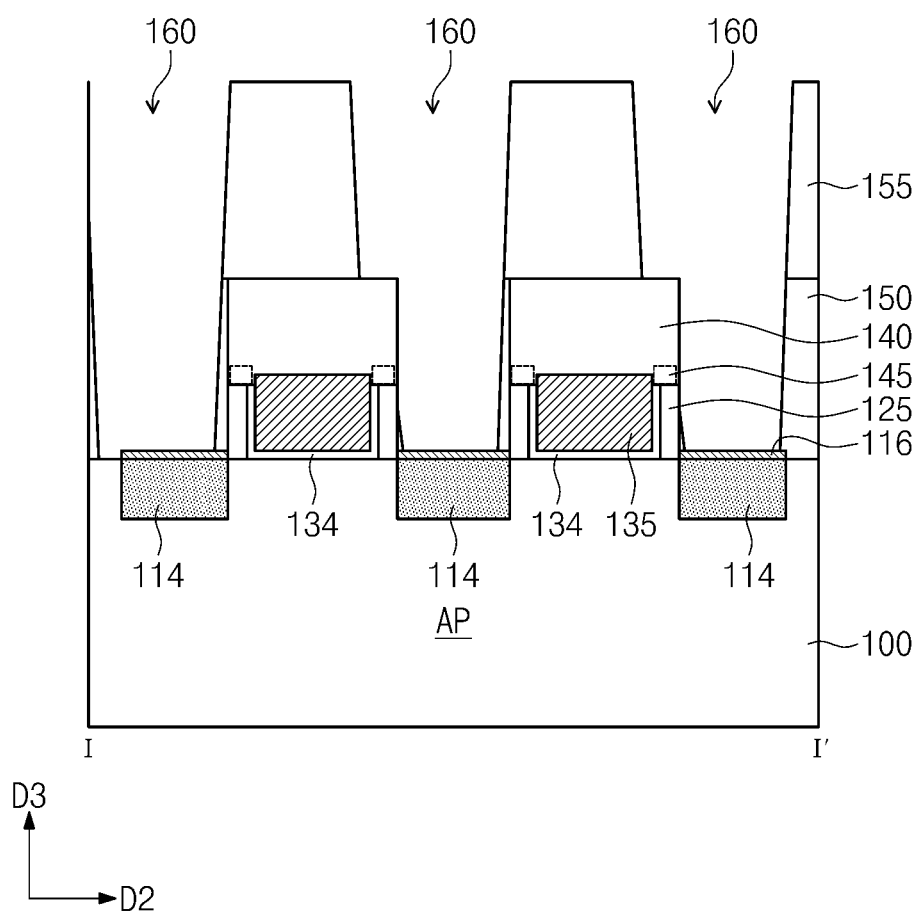

Referring to FIGS. 1 and 3K, the second ILD layer 155 may be formed. The second ILD layer 155 may comprise a silicon oxide layer or a low-k oxide layer. For example, the low-k oxide layer for the second ILD layer 155 may include a carbon-doped silicon oxide layer (e.g., SiCOH). The second ILD layer may be formed using a CVD process.

Thereafter, contact holes 160 may be formed to penetrate the second ILD layer 155 and the first ILD layer 150 and expose top surfaces of the semiconductor capping patterns 116. At least one of the contact holes 160 may expose at least a portion of the gate capping pattern 140. In some example embodiments, each of the contact holes 160 may be a self-align contact hole, which is formed with respect to the gate capping patterns 140 in a self-aligned manner. For example, the formation of the contact holes 160 may include forming a photoresist pattern (not shown) on the second ILD layer 155 to define positions and shapes of the contact holes 160 and performing an anisotropic etching process using the photoresist pattern as an etch mask. When viewed in a plan view, the photoresist pattern may be formed to have openings (not shown), each of which has the same shape as a corresponding one of the contact holes 160.

Since the gate capping patterns 140 is formed of or include a material having a high etch selectivity with respect to the first and second ILD layers 150 and 155, the gate capping pattern 140 can be prevented from being unintentionally etched through the contact holes 160, during the etching process for forming the contact holes 160. Further, even in the case that the spacer structures 125 were damaged in the previous steps, the gate capping patterns 140 may prevent the spacer structures 125 from being exposed by the contact holes 160. In other words, the gate capping patterns 140 make it possible to enlarge a process margin in the etching process for forming the contact holes 160.

Referring back to FIGS. 1 and 2, the contact plugs 165 may be formed in the contact holes 160 to be in contact with the semiconductor capping patterns 116. Each of the contact plugs 165 may be formed to be in contact with at least a portion of the gate capping pattern 140. In some example embodiments, each of the contact plugs 165 may be a self-align contact plug, which is in contact with the gate capping pattern 140 in a self-aligned manner. For example, the formation of the contact plugs 165 may include forming a conductive layer to fill the contact holes 160 and planarizing the conductive layer to expose the top surface of the second ILD layer 155. The conductive layer for the contact plugs 165 may comprise a metallic material (e.g., tungsten). In some example embodiments, the formation of the conductive layer may include sequentially forming a barrier metal layer (e.g., of metal nitride) and a metal layer (e.g., of tungsten).

Figure 4:
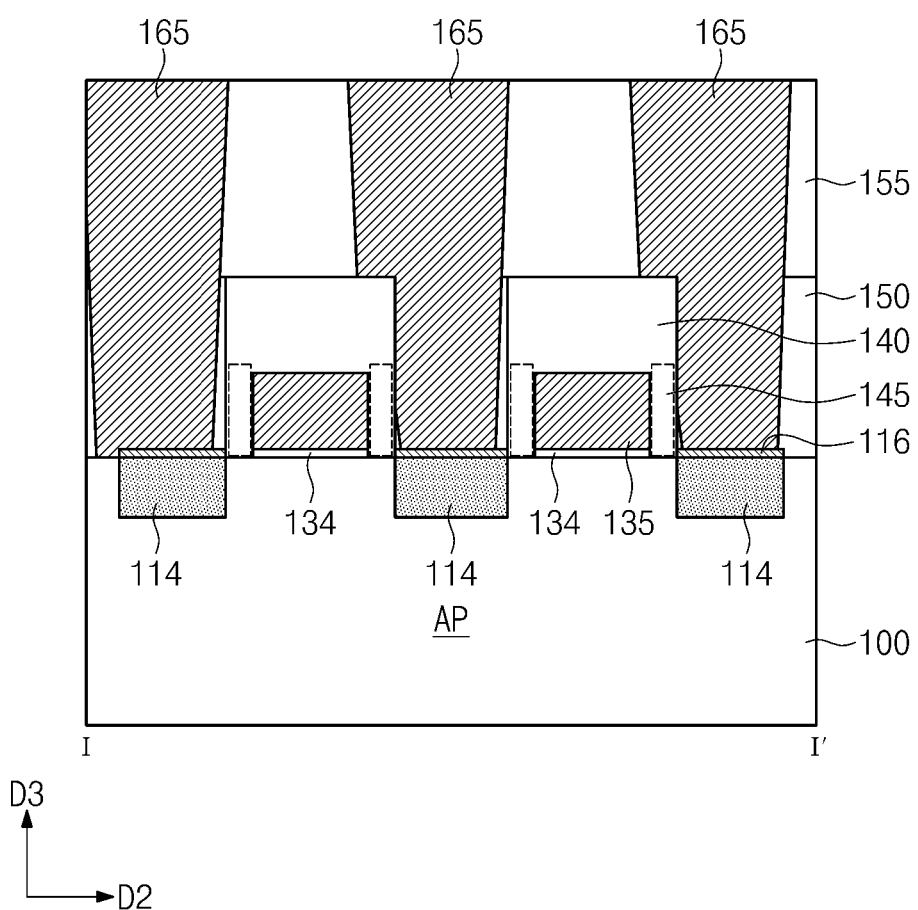
FIG. 4 is a sectional view taken along line I-I' of FIG. 1 to illustrate a semiconductor device according to some example embodiments of the inventive concepts.

FIG. 4 is a sectional view taken along line I-I' of FIG. 1 to illustrate a semiconductor device according to other example embodiments of the inventive concepts. For concise description, an element previously described with reference to FIGS. 1 and 2 may be identified by a similar or identical reference number without repeating an overlapping description thereof.

Referring to FIGS. 1 and 4, the gate capping patterns 140 may be provided on the gate electrodes 135, respectively. Each of the gate capping patterns 140 may include the pair of the extended portions 145 extending toward the substrate 100 and covering both sidewalls of the gate electrode 135. Unlike that of FIG. 2, the extended portions 145 may be farther extended toward the substrate 100. For example, the extended portions 145 may be provided in such a way that bottom surfaces thereof are in direct contact with the top surface of the substrate 100.

In other words, the spacer structures 125 of the previous embodiments may be replaced by the extended portions 145. Even in this case, it is possible to prevent the damaged spacer structures 125 from being etched in the step of forming the contact plugs 165, and it is thereby possible to prevent the gate electrodes 135 from being exposed.

The gate dielectric layers 134 may be provided between the gate electrodes 135 and the substrate 100. The gate dielectric layers 134 may be locally provided only below the gate electrodes 135, respectively.

Figure 5A:
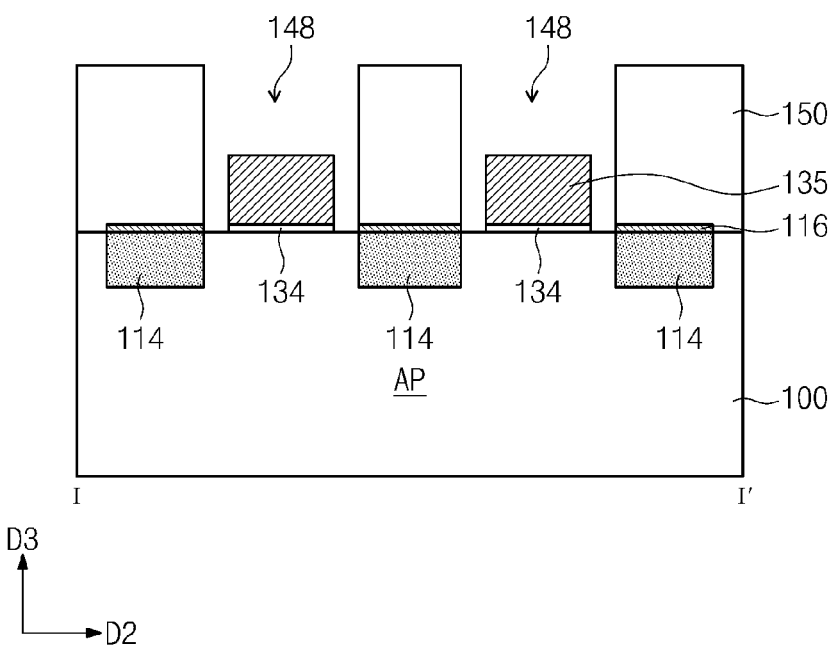
FIGS. 5A and 5B are sectional views illustrating a method of fabricating a semiconductor device, according to some example embodiments of the inventive concepts.
Figure 5B:
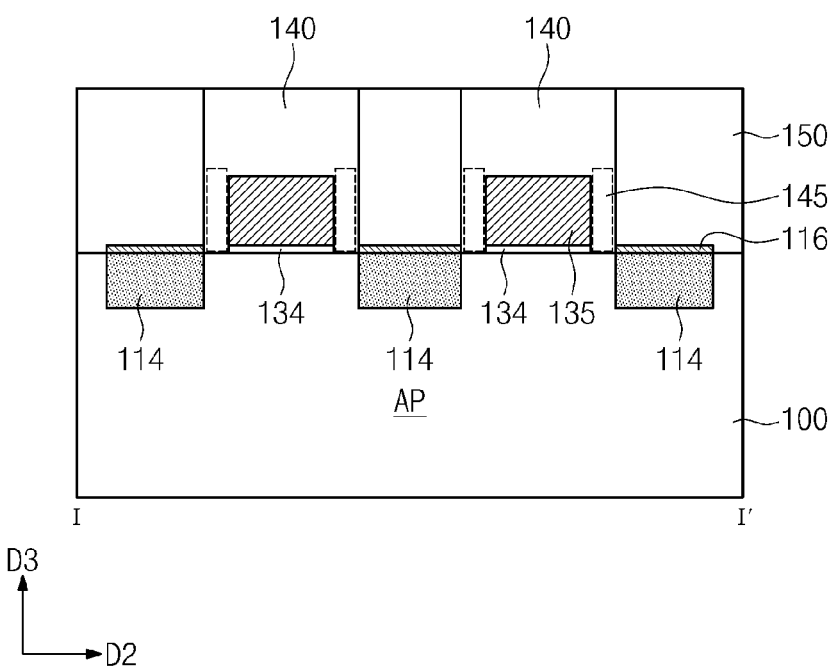

FIGS. 5A and 5B are sectional views illustrating a method of fabricating a semiconductor device, according to other example embodiments of the inventive concepts. In detail, each of FIGS. 5A and 5B is a sectional view taken along line I-I' of FIG. 1. For concise description, an element or step of the fabrication method previously described with reference to FIGS. 3A through 3K may be identified by a similar or identical reference number without repeating an overlapping description thereof.

Referring to FIGS. 1 and 5A, in conjunction with FIG. 3G, top portions of the preliminary gate electrodes 131 may be recessed to form the gate electrodes 135. Next, the spacers 120 may be recessed to form the second recessed regions 148. The recessing of the spacers 120 may be performed to partially remove the gate dielectric layer 134 thereunder, and thus, the top surface of the substrate 100 may be partially exposed through the second recessed regions 148. Accordingly, each of the second recessed regions 148 may be formed to expose the top and both side surfaces of the gate electrodes 135 and inner sidewalls of the first ILD layer 150.

Referring to FIGS. 1 and 5B, the gate capping insulating layer 141 may be formed, and then, a planarization process may be performed on the gate capping insulating layer 141 to form the gate capping patterns 140. The gate capping insulating layer 141 may be formed using a deposition process with a good step coverage property. For example, the gate capping insulating layer 141 may be formed using a CVD or ALD process. Further, the gate capping insulating layer 141 may be formed to completely fill the second recessed regions 148.

Referring back to FIGS. 1 and 4, the second ILD layer 155 may be formed, and then, as shown in FIG. 3K, the contact holes 160 may be formed to penetrate the second and first ILD layers 155 and 150 and expose the top surfaces of the semiconductor capping patterns 116, respectively. Thereafter, in the contact holes 160, the contact plugs 165 may be formed to be in contact with the semiconductor capping patterns 116, respectively.

Figure 6:
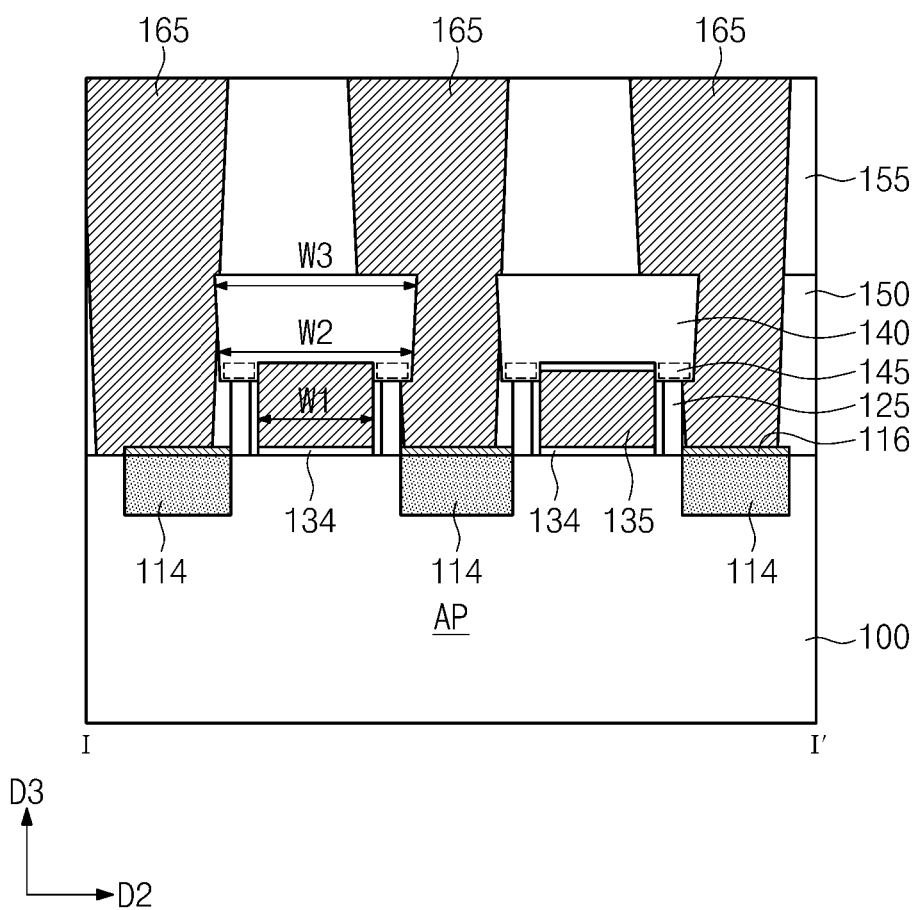
FIG. 6 is a sectional view taken along line I-I' of FIG. 1 to illustrate a semiconductor device according to some example embodiments of the inventive concepts.

FIG. 6 is a sectional view taken along line I-I' of FIG. 1 to illustrate a semiconductor device according to still other example embodiments of the inventive concepts. For concise description, an element previously described with reference to FIGS. 1 and 2 may be identified by a similar or identical reference number without repeating an overlapping description thereof.

Referring to FIGS. 1 and 6, the gate capping patterns 140 may be provided on the gate electrodes 135, respectively. Each of the gate capping patterns 140 may include the pair of the extended portions 145 extending toward the substrate 100 and covering both sidewalls of the gate electrode 135. A top width W3 of the gate capping pattern 140 may be larger than a bottom width W2 thereof. In other words, the width of the gate capping pattern 140 may increase with increasing distance from the substrate 100. The top and bottom widths W2 and W3 of the gate capping pattern 140 may be larger than a width W1 of the gate electrode 135.

According to the present embodiments, top portions of the gate capping patterns 140 may have an increased width, compared with that of FIG. 2. This means that the gate capping patterns 140 can more effectively protect the gate electrodes 135 from damage when the contact plugs 165 are formed.

Figure 7A:
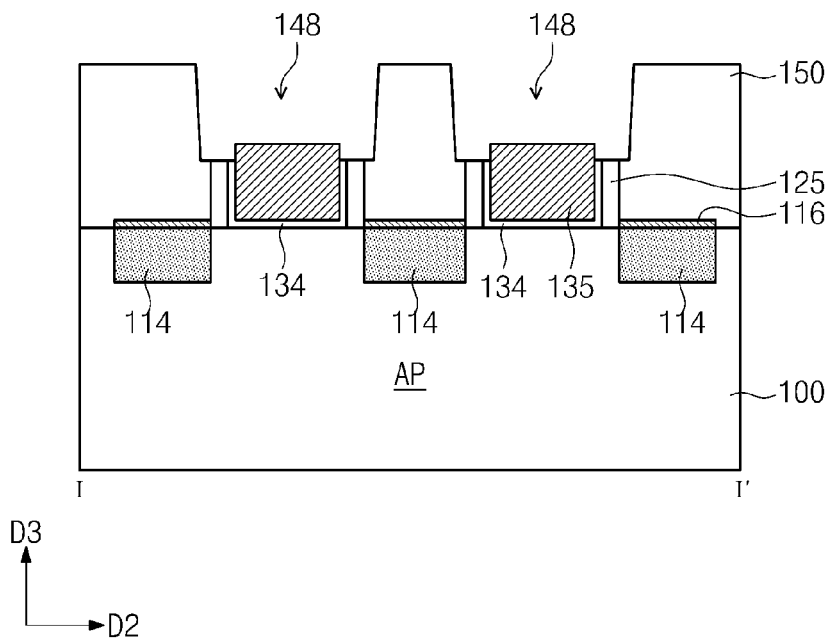
FIGS. 7A and 7B are sectional views illustrating a method of fabricating a semiconductor device, according to some example embodiments of the inventive concepts.
Figure 7B:
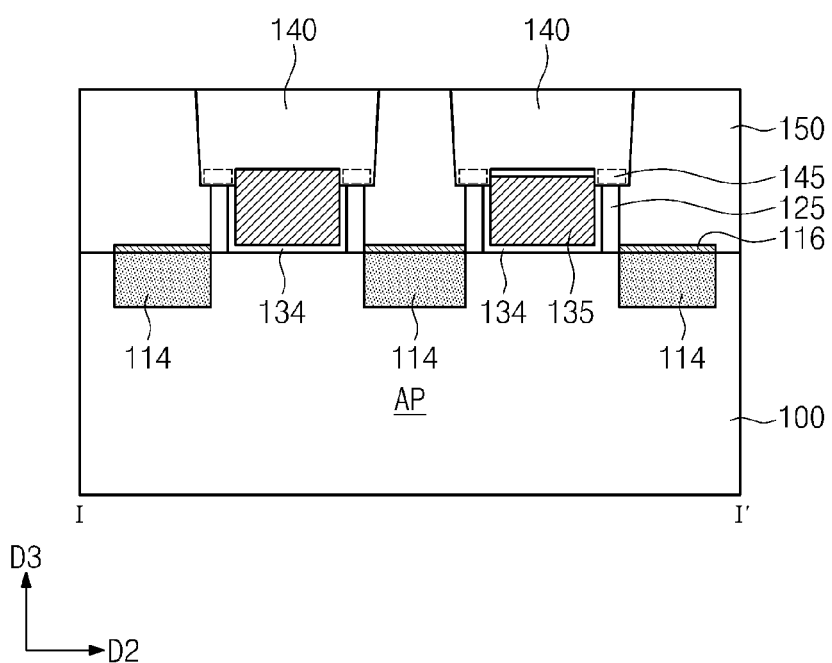

FIGS. 7A and 7B are sectional views illustrating a method of fabricating a semiconductor device, according to still other example embodiments of the inventive concepts. In detail, each of FIGS. 7A and 7B is a sectional view taken along line I-I' of FIG. 1. For concise description, an element or step of the fabrication method previously described with reference to FIGS. 3A through 3K may be identified by a similar or identical reference number without repeating an overlapping description thereof.

Referring to FIGS. 1 and 7A, in conjunction with FIG. 3G, top portions of the preliminary gate electrodes 131 may be recessed to form the gate electrodes 135. Next, the spacers 120 may be recessed to form the second recessed regions 148. Here, a portion of the first ILD layer 150, which is in contact with the spacers 120, may be etched along with the spacers 120. In certain embodiments, the first ILD layer 150 may be etched to have an inclined sidewall profile; that is, the second recessed region 148 may be formed to have an inclined inner side surface. In other words, the width of the second recessed region 148 may increase with increasing distance from the substrate 100.

Referring to FIGS. 1 and 7B, the gate capping insulating layer 141 may be formed, and then, a planarization process may be performed on the gate capping insulating layer 141 to form the gate capping patterns 140. The gate capping insulating layer 141 may be formed using a deposition process with a good step coverage property. For example, the gate capping insulating layer 141 may be formed using a CVD or ALD process. Further, the gate capping insulating layer 141 may be formed to completely fill the second recessed regions 148. According to the present embodiments, since the second recessed region 148 has the inclined inner side surface, it is possible to more efficiently fill the whole space of the second recessed region 148 with the gate capping insulating layer 141.

Referring back to FIGS. 1 and 6, the second ILD layer 155 may be formed, and then, as shown in FIG. 3K, the contact holes 160 may be formed to penetrate the second and first ILD layers 155 and 150 and expose the top surfaces of the semiconductor capping patterns 116, respectively. Thereafter, in the contact holes 160, the contact plugs 165 may be formed to be in contact with the semiconductor capping patterns 116, respectively.

Figure 8:
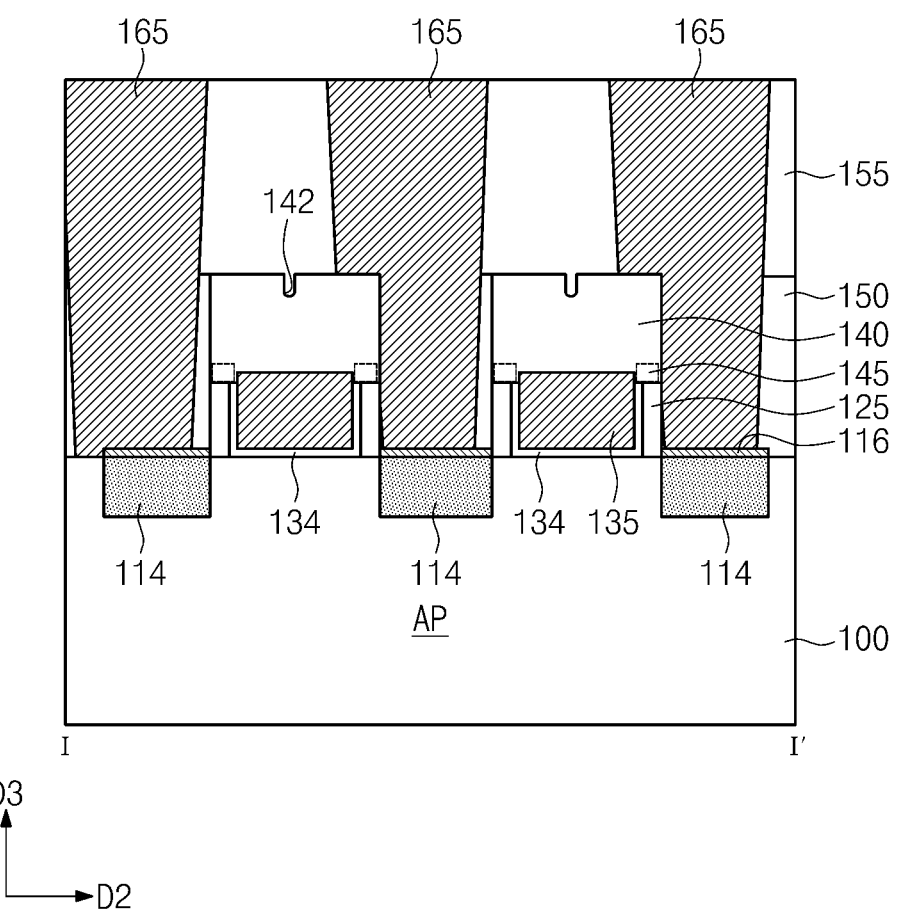
FIG. 8 is a sectional view taken along line I-I' of FIG. 1 to illustrate a semiconductor device according to some example embodiments of the inventive concepts.

FIG. 8 is a sectional view taken along line I-I' of FIG. 1 to illustrate a semiconductor device according to even other example embodiments of the inventive concepts. For concise description, an element previously described with reference to FIGS. 1 and 2 may be identified by a similar or identical reference number without repeating an overlapping description thereof.

Referring to FIGS. 1 and 8, the gate capping patterns 140 may be provided on the gate electrodes 135, respectively. Each of the gate capping patterns 140 may have a seam 142 formed in an upper portion thereof. When viewed in a plan view, the seam 142 may be formed at or near a center of the gate capping pattern 140. The seam 142 may be a sharp trench or groove, which may be formed in a top surface of the gate capping pattern 140. When viewed in plan view, the seam 142 may not be overlapped with any of the contact plugs 165. In other words, the seam 142 may be locally formed at a central portion of the top surface of the gate capping pattern 140, and thus, it may not be exposed in an etching process for forming the contact hole. Accordingly, a process margin in the etching process for forming the contact hole may not be affected by the presence of the seam 142.

Figure 9A:
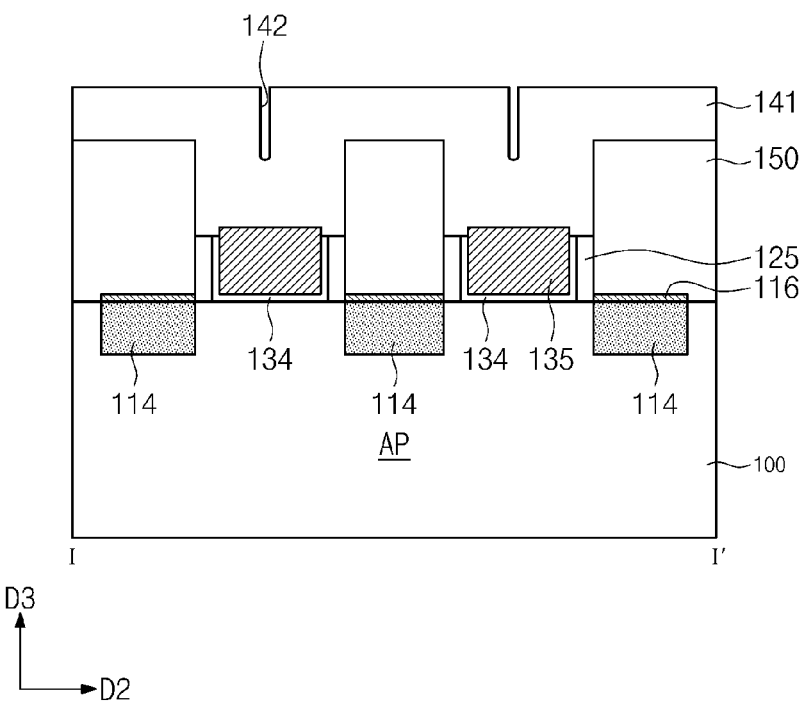
FIGS. 9A and 9B are sectional views illustrating a method of fabricating a semiconductor device, according to some example embodiments of the inventive concepts.
Figure 9B:
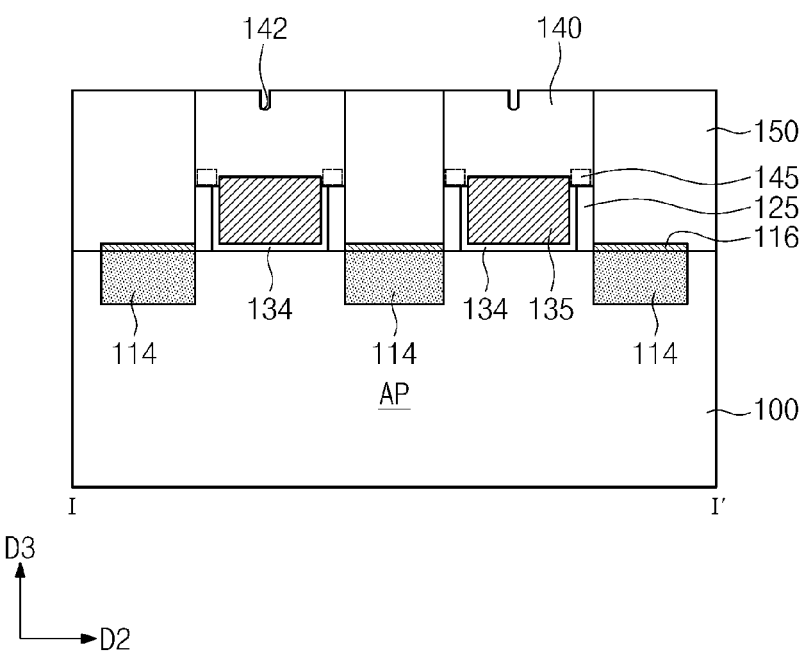

FIGS. 9A and 9B are sectional views illustrating a method of fabricating a semiconductor device, according to even other example embodiments of the inventive concepts. In detail, each of FIGS. 9A and 9B is a sectional view taken along line I-I' of FIG. 1. For concise description, an element or step of the fabrication method previously described with reference to FIGS. 3A through 3K may be identified by a similar or identical reference number without repeating an overlapping description thereof.

Referring to FIGS. 1 and 9A, the gate capping insulating layer 141 may be formed to have the seams 142 at the top surface thereof. Unlike those of FIG. 3I, in the present embodiments, the seams 142 may have bottom surfaces that are formed at a lower level than the top surface of the first ILD layer 150.

Referring to FIGS. 1 and 9B, a planarization process may be performed on the gate capping insulating layer 141 to form the gate capping patterns 140. Since the bottom surfaces of the seams 142 are positioned at a lower level than the top surface of the first ILD layer 150, portions of the seams 142 may remain at the top surface of the gate capping pattern 140, after the planarization process.

Referring back to FIGS. 1 and 8, the second ILD layer 155 may be formed, and then, as shown in FIG. 3K, the contact holes 160 may be formed to penetrate the second and first ILD layers 155 and 150 and expose the top surfaces of the semiconductor capping patterns 116, respectively. Thereafter, in the contact holes 160, the contact plugs 165 may be formed to be in contact with the semiconductor capping patterns 116, respectively.

Figure 10:
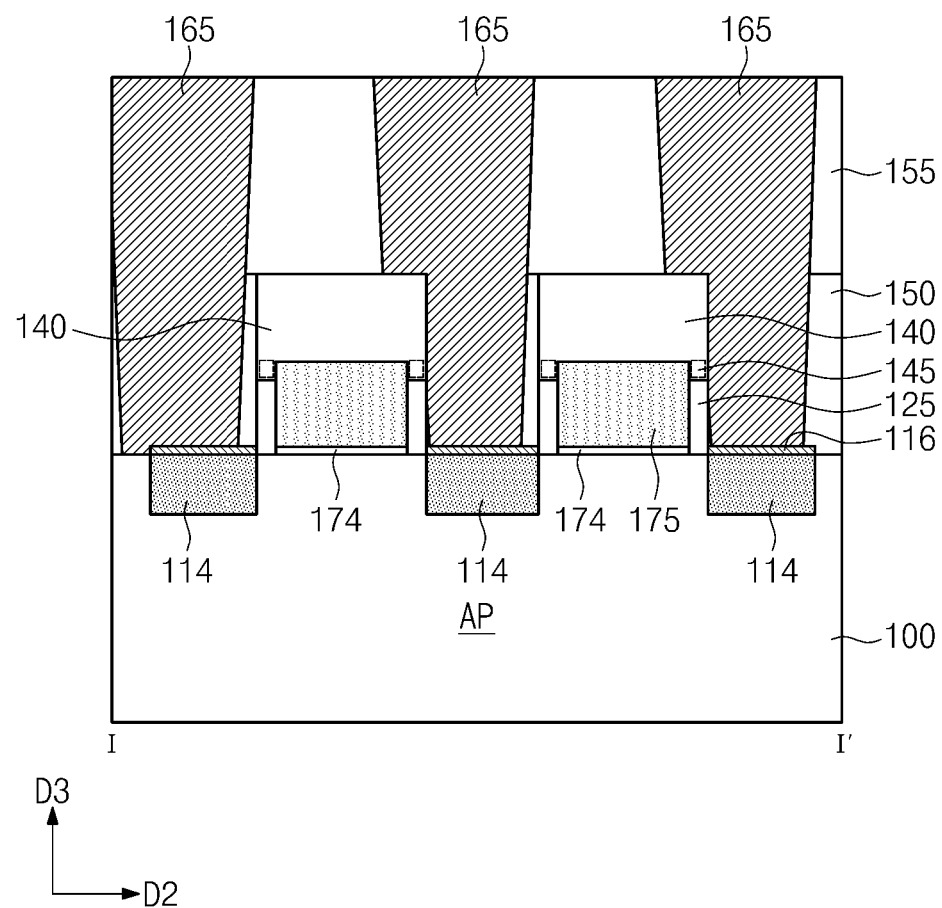
FIG. 10 is a sectional view taken along line I-I' of FIG. 1 to illustrate a semiconductor device according to some example embodiments of the inventive concepts.

FIG. 10 is a sectional view taken along line I-I' of FIG. 1 to illustrate a semiconductor device according to yet other example embodiments of the inventive concepts. For concise description, an element previously described with reference to FIGS. 1 and 2 may be identified by a similar or identical reference number without repeating an overlapping description thereof.

Referring to FIGS. 1 and 10, conductive patterns 175 may be provided on the substrate 100. The conductive patterns 175 may comprise at least one of poly silicon, metal nitrides (e.g., titanium nitride or tantalum nitride), or metals (e.g., titanium, tantalum, tungsten, copper, or aluminum). In certain embodiments, the conductive patterns 175 may be formed of a doped poly silicon layer.

Each of the conductive patterns 175 may be a line- or bar-shaped structure crossing the active pattern AP and extending parallel to the first direction D1. A plurality of the conductive patterns 175 may be provided to cross at least one active pattern AP. For example, a pair of the conductive patterns 175 may be provided spaced apart from each other in the second direction D2, and each of them may be provided on each active pattern AP to extend parallel to the first direction D1. For the sake of simplicity, the description that follows will refer to an example in which a pair of the conductive patterns 175 are provided spaced apart from each other in the second direction D2 to cross one of the active patterns AP.

In certain embodiments, each of the conductive patterns 175 may serve as a gate electrode of a transistor. The spacer structures 125 may be provided on both sidewalls of each of the conductive patterns 175. The spacer structures 125 may extend along the conductive patterns 175 or parallel to the first direction D1. The spacer structures 125 may have top surfaces that are lower than those of the conductive patterns 175.

Dielectric patterns 174 may be disposed between the conductive patterns 175 and the substrate 100. The dielectric patterns 174 may extend along the conductive patterns 175 or parallel to the first direction D1. In some example embodiments, the dielectric patterns 174 may comprise at least one of high-k materials.

The gate capping patterns 140 may be provided on the conductive patterns 175, respectively. Each of the gate capping patterns 140 may include the pair of the extended portions 145 extending toward the substrate 100 and covering both sidewalls of the conductive pattern 175. The gate capping pattern 140 may be configured to have substantially the same features as that previously described with reference to FIGS. 1 and 2.

The epitaxial patterns 114 may be provided between the conductive patterns 175 to be in contact with the active pattern AP. The epitaxial patterns 114 also may be provided on both sides of the gate the gate electrode 135. Further, the semiconductor capping patterns 116 may be provided on the epitaxial patterns 114, respectively. Although not shown, a metal silicide layer may be further provided on each of the semiconductor capping patterns 116.

The first ILD layer 150 may be provided on the substrate 100. The first ILD layer 150 may have a top surface that is substantially coplanar with those of the gate capping patterns 140. The second ILD layer 155 may be provided on the first ILD layer 150 to cover the gate capping patterns 140.

The contact plugs 165 may be provided on the substrate 100 to penetrate the second and first ILD layers 155 and 150 and be in contact with the semiconductor capping patterns 116, respectively. At least one of the contact plugs 165 may be in direct contact with the gate capping pattern 140.

FIGS. 11A through 11E are sectional views illustrating a method of fabricating a semiconductor device, according to yet other example embodiments of the inventive concepts. In detail, each of FIGS. 11A through 11E is a sectional view taken along line I-I' of FIG. 1. For concise description, an element or step of the fabrication method previously described with reference to FIGS. 3A through 3K may be identified by a similar or identical reference number without repeating an overlapping description thereof.

Figure 11A:
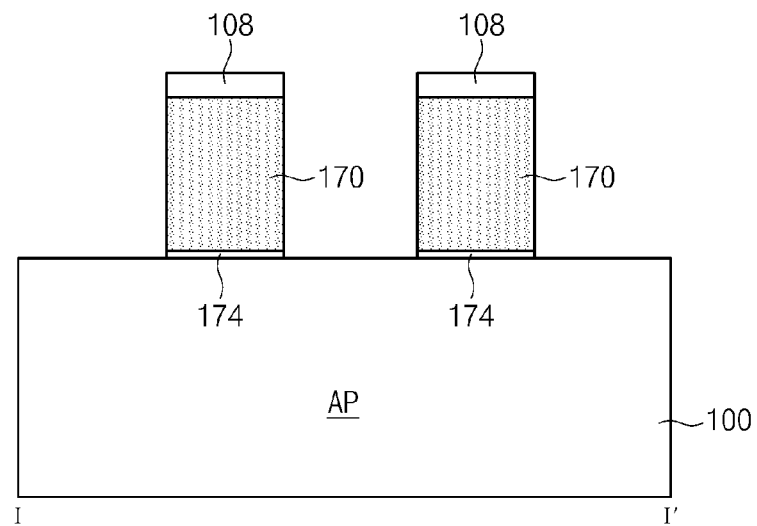
FIGS. 11A through 11E are sectional views illustrating a method of fabricating a semiconductor device, according to some example embodiments of the inventive concepts.

Referring to FIGS. 1 and 11A, a plurality of preliminary stacks may be formed on the substrate 100. Each of the preliminary stacks may include a dielectric pattern 174, a preliminary conductive pattern 170, and a gate mask pattern 108, which are sequentially stacked on the substrate 100. Each of the preliminary stacks may be a line- or bar-shaped structure crossing the active pattern AP or extending parallel to the first direction D1. In some example embodiments, the formation of the preliminary stacks may include sequentially forming a dielectric layer, a preliminary conductive layer (not shown), and a gate mask layer on the substrate 100 and then patterning them to cross the active pattern AP.

The dielectric layer may include a low-k material or a high-k material. In some example embodiments, the low-k material may include a silicon oxide layer. The high-k material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or any combination thereof.

The preliminary conductive layer include at least one of poly silicon, metal nitrides (e.g., titanium nitride or tantalum nitride), or metals (e.g., titanium, tantalum, tungsten, copper, or aluminum). The poly silicon may be provided in the form of a doped poly silicon layer.

The gate mask layer may include a silicon nitride layer and/or a silicon oxynitride layer.

Figure 11B:
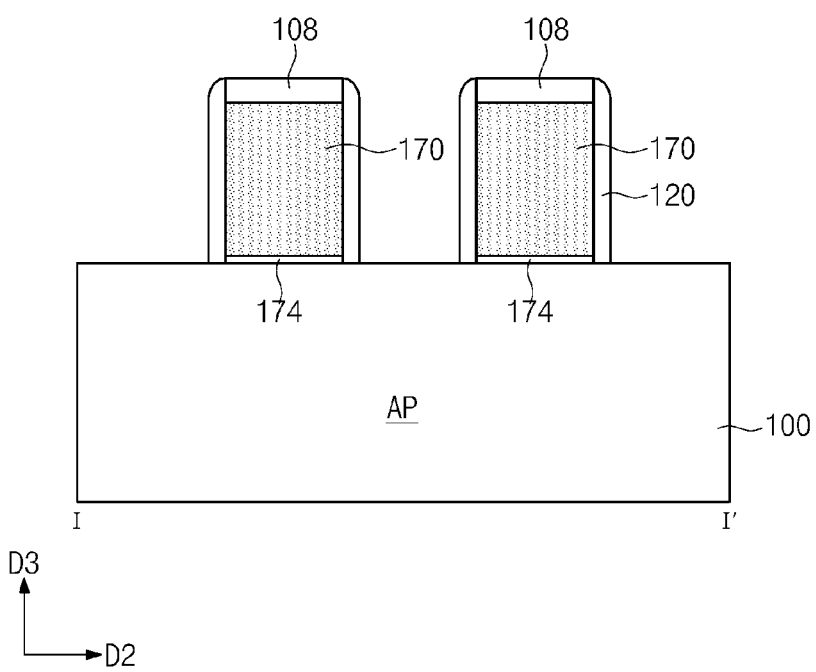

Referring to FIGS. 1 and 11B, the spacers 120 may be formed on both sidewalls of the preliminary conductive patterns 170. The spacers 120 may be formed to cover both sidewalls of the dielectric patterns 174.

Figure 11C:
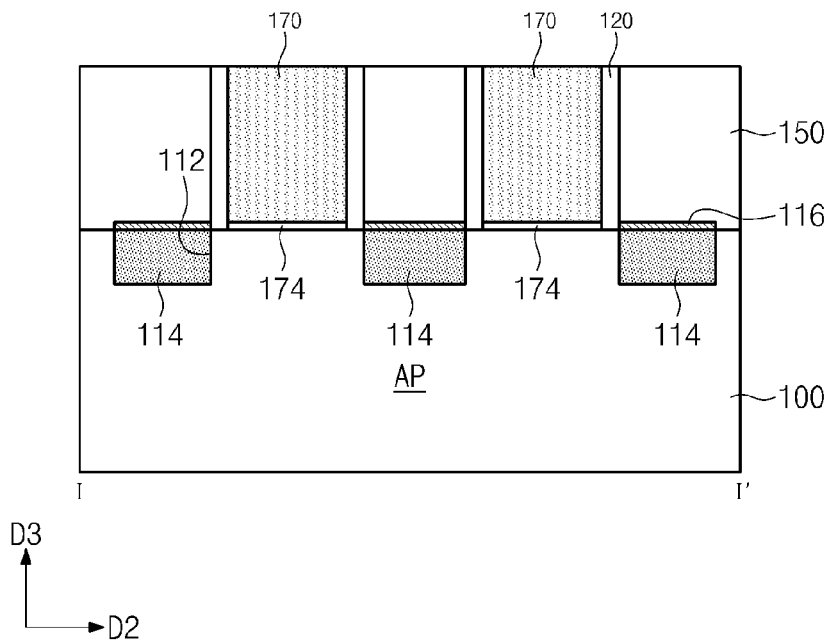

Referring to FIGS. 1 and 11C, as shown in FIGS. 3C and 3D, the active pattern AP may be etched to form the first recessed regions 112, and then, the epitaxial patterns 114 may be formed in the first recessed regions 112, respectively. Thereafter, the semiconductor capping patterns 116 may be formed on the epitaxial patterns 114, respectively.

Thereafter, the first ILD layer 150 may be formed on the resulting structure with the semiconductor capping patterns 116. The formation of the first ILD layer 150 may include forming an insulating layer to cover the structure provided with the preliminary conductive patterns 170 and the gate mask patterns 108 and then planarizing the insulating layer to expose top surfaces of the preliminary conductive patterns 170.

Figure 11D:
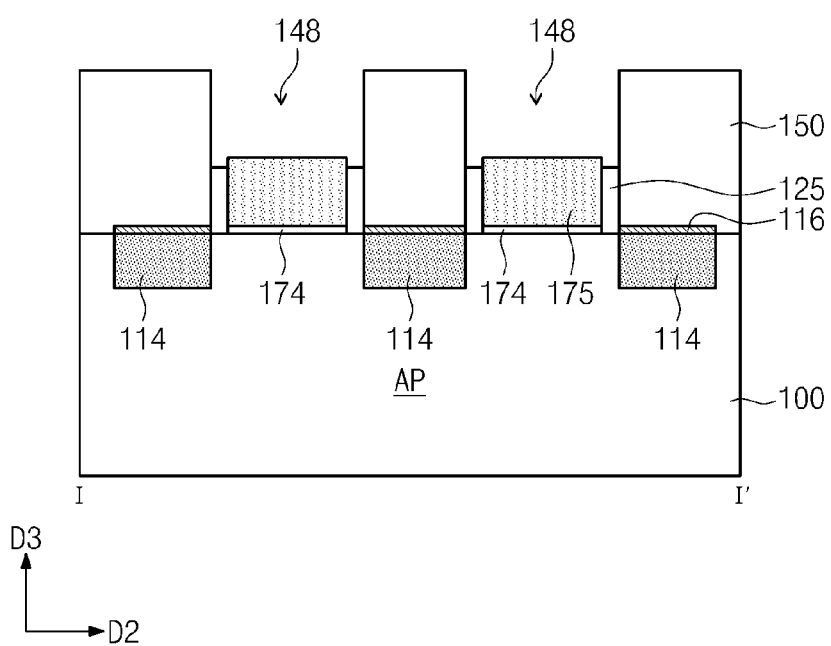

Referring to FIGS. 1 and 11D, the preliminary conductive patterns 170 may be downward recessed to form the conductive patterns 175. For example, the conductive patterns 175 may be formed by a process of selectively etching the preliminary conductive patterns 170; for example, the selective etching process may be performed to suppress the spacers 120 and the first ILD layer 150 from being etched.

Next, the spacers 120 may be recessed to form the spacer structures 125 and define second recessed regions 148. Each of the second recessed regions 148 may be formed to expose the top surface and both upper side surfaces of the conductive pattern 175, the top surfaces of the spacer structures 125, and the inner sidewalls of the first ILD layer 150.

Figure 11E:
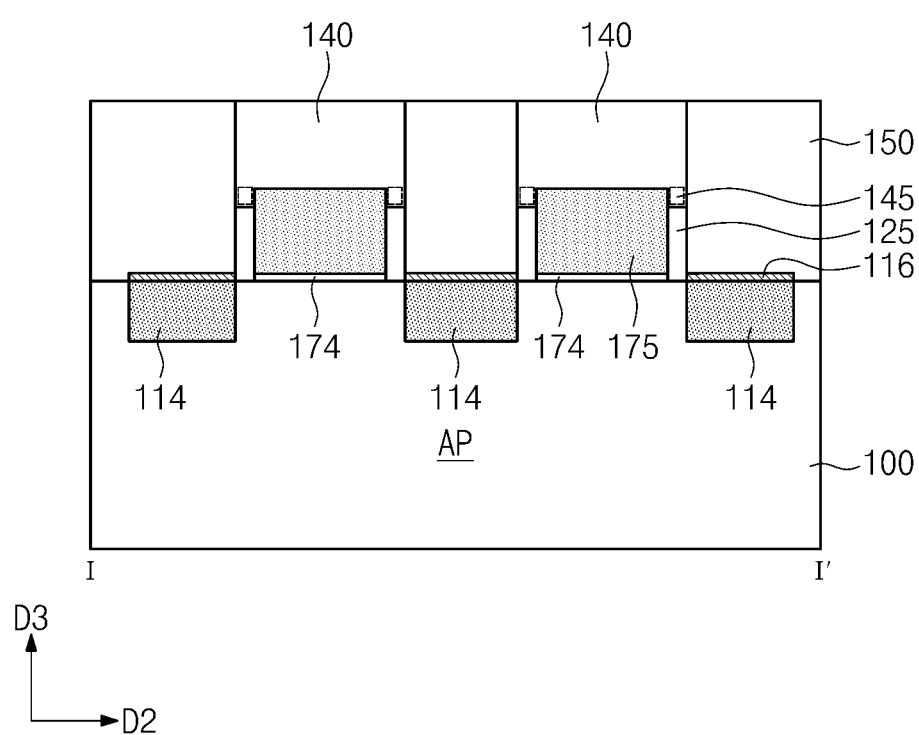

Referring to FIGS. 1 and 11E, a capping insulating layer (not shown) may be formed to cover the top surfaces of the conductive patterns 175. The capping insulating layer (not shown) may be formed to fill the second recessed regions 148 and cover the top surface of the first ILD layer 150. The capping insulating layer may be formed using the same method as that for forming the gate capping insulating layer 141 described with reference to FIG. 3I.

A planarization process may be performed on the capping insulating layer to form the gate capping patterns 140. The planarization process may be performed to expose the top surface of the first ILD layer 150. The gate capping patterns 140 may be formed on the conductive patterns 175, respectively, to extend along the conductive patterns 175 or parallel to the first direction D1.

Referring back to FIGS. 1 and 10, the second ILD layer 155 may be formed, and then, as shown in FIG. 3K, the contact holes 160 may be formed to penetrate the second and first ILD layers 155 and 150 and expose the top surfaces of the semiconductor capping patterns 116, respectively. Thereafter, in the contact holes 160, the contact plugs 165 may be formed to be in contact with the semiconductor capping patterns 116, respectively.

Figure 12A:
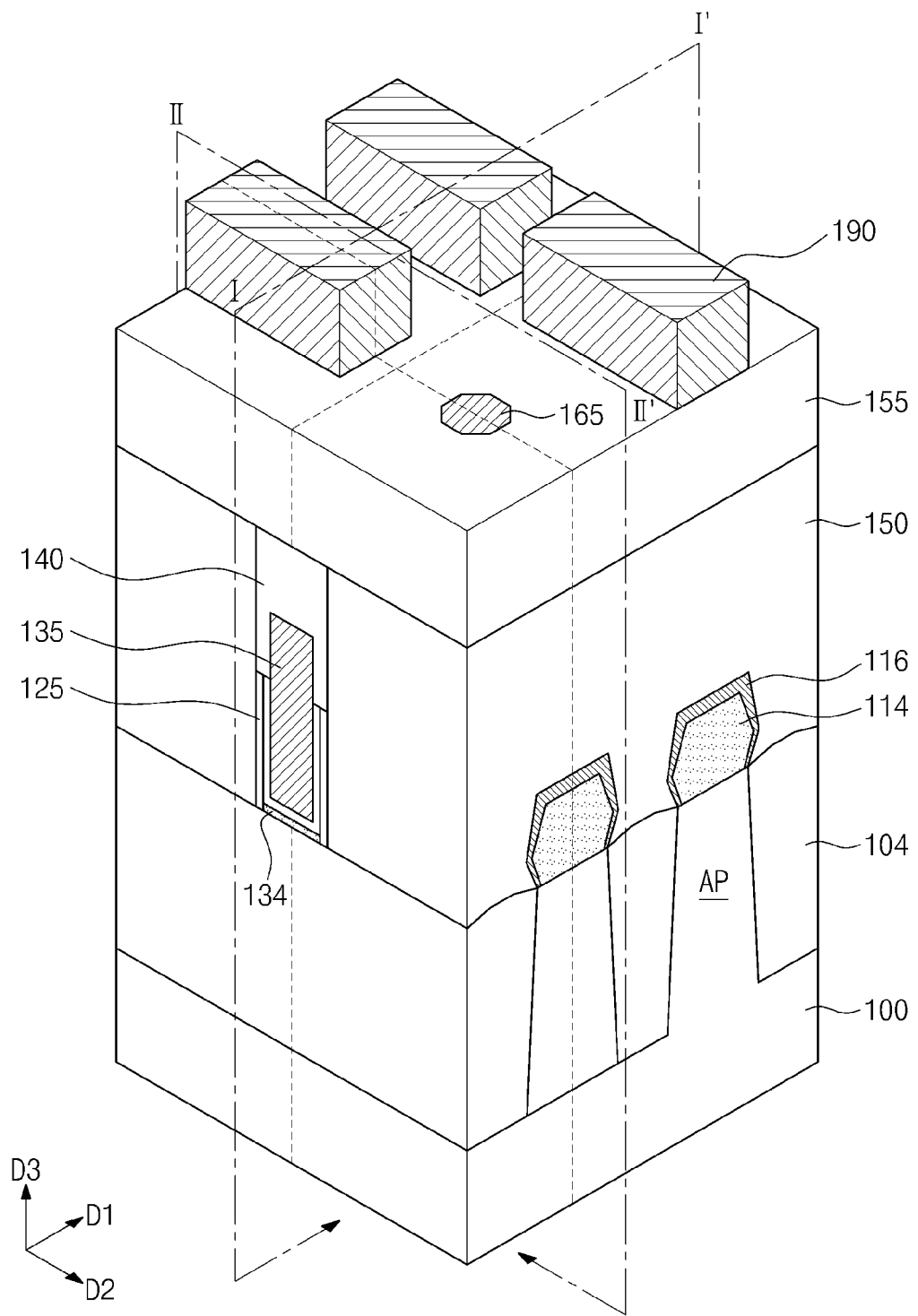
FIG. 12A is a perspective view illustrating a semiconductor device according to some example embodiments of the inventive concepts.
Figure 12B:
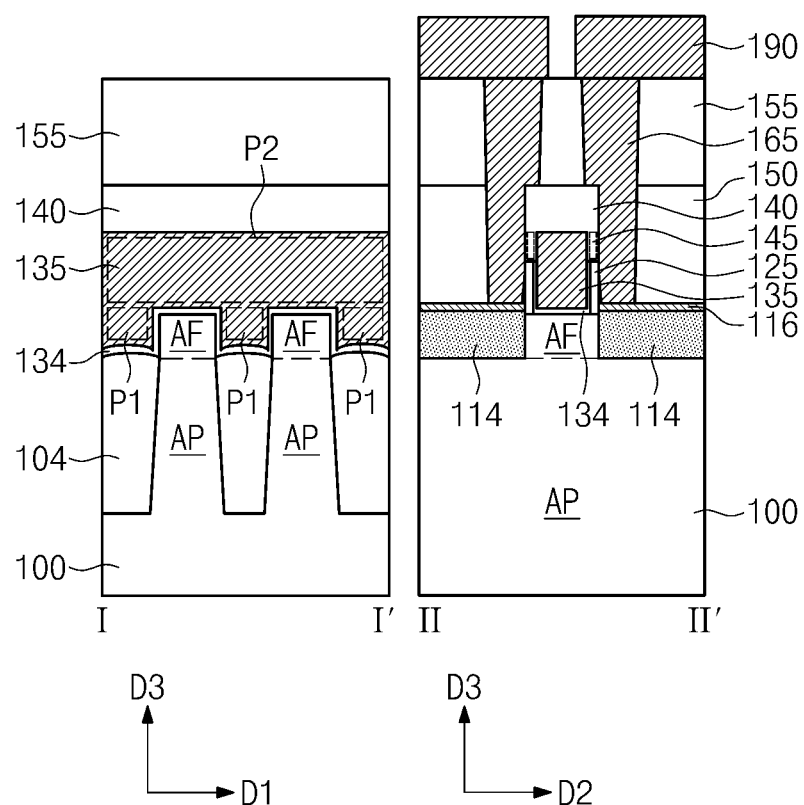
FIG. 12B is a sectional view taken alone lines I-I' and II-II' of FIG. 12A.

FIG. 12A is a perspective view illustrating a semiconductor device according to further example embodiments of the inventive concepts. FIG. 12B is a sectional view taken alone lines I-I' and II-II' of FIG. 12A. For concise description, an element previously described with reference to FIGS. 1 and 2 may be identified by a similar or identical reference number without repeating an overlapping description thereof.

Referring to FIGS. 12A and 12B, the device isolation patterns 104 may be provided in the substrate 100 to define the active pattern AP. The device isolation patterns 104 may be arranged along the first direction D1, which is parallel to the top surface of the substrate 100, and each of them may be a line-shaped structure extending along the second direction D2 or crossing the first direction D1. The active pattern AP may be a line-shaped structure extending along the second direction D2 or parallel to the device isolation patterns 104.

The gate electrode 135 may be disposed on the substrate 100 to cross the active pattern AP. The active pattern AP may include active fins AF positioned below the gate electrode 135. The active fins AF may be portions of the active pattern AP, which protrudes toward a direction normal to the top surface of the substrate 100 or the third direction D3. Each of the active fins AF may include a channel region. The gate electrode 135 may be provided to face top and side surfaces of the active fins AF. For example, the gate electrode 135 may include first portions P1, which are provided to face both sidewalls of each of the active fins AF, and a second portion P2, which is provided on the active fins AF to connect the first portions P1 to each other. In other words, the gate electrode 135 may be a line-shaped structure crossing the active fins AF and extending parallel to the first direction D1.

The epitaxial patterns 114 may be provided on portions of the active pattern AP positioned at both sides of the gate electrode 135. The epitaxial patterns 114 may be patterns epitaxially grown from the active pattern AP and may serve as source/drain regions of a field effect transistor. When viewed in a sectional view, top surfaces of the active fins AF may be positioned at a higher level than the bottom surfaces of the epitaxial patterns 114. The top surfaces of the epitaxial patterns 114 may be positioned at the same level as or a higher level than those of the active fins AF. When viewed in a plan view, each of the active fins AF may be positioned between a pair of the epitaxial patterns 114.

The semiconductor capping patterns 116 may be provided on the epitaxial patterns 114. The semiconductor capping patterns 116 may be provided to be in contact with the source/drain regions of the field effect transistor. Although not shown, a metal silicide layer may be further provided on each of the semiconductor capping patterns 116.

The spacer structures 125 may be provided on both sidewalls of the gate electrode 135. The spacer structures 125 may extend along the gate electrode 135 or parallel to the first direction D1.

The gate dielectric layer 134 may be provided between the gate electrode 135 and the active fins AF and between the gate electrode 135 and the spacer structures 125. The gate dielectric layer 134 may extend along the bottom surface of the gate electrode 135. Accordingly, the gate dielectric layer 134 may be provided to cover the top and side surfaces of the active fins AF. The gate dielectric layer 134 may include a portion horizontally extending from the active fins AF and partially covering top surfaces of the device isolation patterns 104. However, in certain embodiments, the gate dielectric layer 134 may be provided to expose at least a portion of the top surface of the device isolation pattern 104. The exposed portion of the device isolation pattern 104, which is not covered with the gate dielectric layer 134, may be covered by the first ILD layer 150.

The gate capping pattern 140 may be provided on the gate electrode 135. The gate capping pattern 140 may extend along the gate electrode 135 or parallel to the first direction D1. The gate capping pattern 140 in the present embodiment may be configured to have the same features as one of the gate capping patterns 140 previously described with reference to FIGS. 1, 2, 4, 6, 8, and 10.

The first ILD layer 150 may be provided on the substrate 100. The first ILD layer 150 may be provided to cover the gate capping patterns 140, the spacer structures 125, and the semiconductor capping patterns 116. The first ILD layer 150 may have the top surface that is substantially coplanar with that of the gate capping pattern 140. The second ILD layer 155 may be formed on the first ILD layer 150 to cover the gate capping patterns 140.

The contact plugs 165 may be provided on the substrate 100 to penetrate the second and first ILD layers 155 and 150 and be in contact with the semiconductor capping patterns 116, respectively. At least one of the contact plugs 165 may be in direct contact with the gate capping pattern 140. However, due to the presence of the gate capping pattern 140, the contact plugs 165 may be electrically and spatially separate from the gate electrode 135. Interconnection lines 190 may be provided on the second ILD layer 155 and may be electrically connected to the contact plugs 165.

Figure 13:
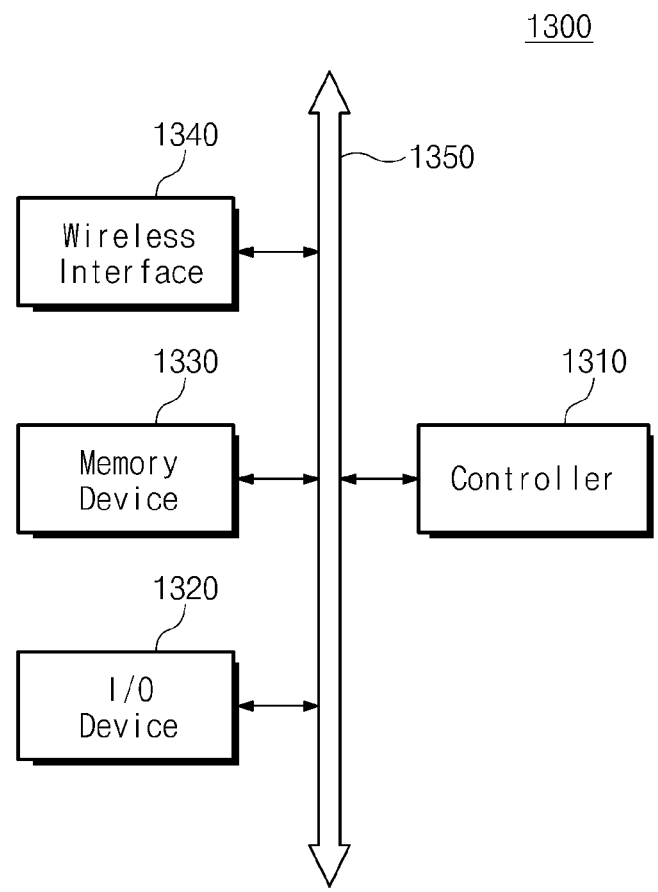
FIGS. 13 and 14 are block diagrams exemplarily illustrating electronic devices including a semiconductor device according to some example embodiments of the inventive concepts.
Figure 14:
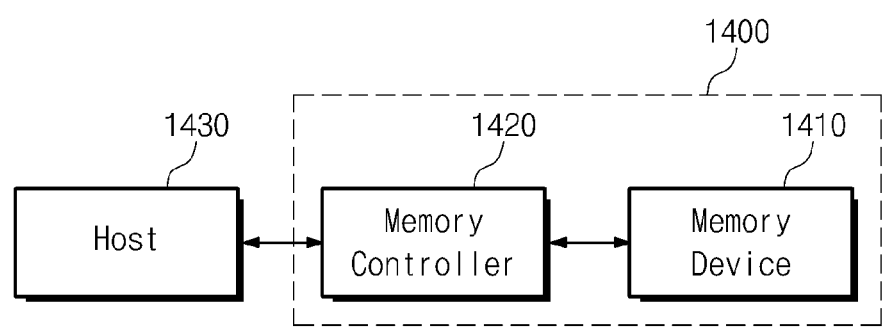

FIGS. 13 and 14 are block diagrams exemplarily illustrating electronic devices including a semiconductor device according to some example embodiments of the inventive concepts.

Referring to FIG. 13, an electronic device 1300 including a semiconductor device according to some example embodiments of the inventive concepts may be used in one of a personal digital assistant (PDA), a laptop computer, a mobile computer, a web tablet, a wireless phone, a cell phone, a digital music player, a wired or wireless electronic device, or a complex electronic device including a combination of such functionalities. The electronic device 1300 may include a controller 1310, an input/output device(s) 1320 (such as a keypad, a keyboard, a display, etc.), a memory 1330, and/or a wireless interface 1340 that are connected/coupled to each other through a bus 1350. The controller 1310 may include, for example, at least one microprocessor, a digital signal process, a microcontroller, etc. The memory 1330 may be configured to store a command code to be used by the controller 1310 and/or user data. The memory 1330 may include a semiconductor device according to some example embodiments of inventive concepts. The electronic device 1300 may use a wireless interface 1340 configured to transmit data to and/or receive data from a wireless communication network using a RF (radio frequency) signal. The wireless interface 1340 may include, for example, an antenna, a wireless transceiver, etc. The electronic system 1300 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 14, a memory system including a semiconductor device according to some example embodiments of inventive concepts will be described. The memory system 1400 may include a memory device 1410 for storing relatively large quantities of data and a memory controller 1420. The memory controller 1420 controls the memory device 1410 so as to read data stored in the memory device 1410 and/or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to some example embodiments of inventive concepts.

According to some example embodiments of the inventive concepts, a semiconductor device may include a gate capping pattern disposed on a gate electrode. The gate capping pattern may be wider than the gate electrode, and thus, it can be used to form a contact plug in a self-aligned manner, without any short circuit between the contact plug and the gate electrode. Accordingly, it is possible to provide a semiconductor device with improved electric characteristics and a method of fabricating the same with an enlarged process margin.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including an active pattern;
a gate electrode crossing the active pattern;
gate spacer structures at both sidewalls of the gate electrode;
a gate capping pattern on the gate electrode, the gate capping pattern having an upper surface that is substantially flat; and
an insulating layer covering a top surface of the gate capping pattern from a top and covering at least one of two opposing sides of the gate capping pattern from at least one side, the gate capping pattern having an etch selectivity with respect to the insulating layer,
wherein the gate capping pattern has a width larger than that of the gate electrode,
the gate capping pattern includes extended portions extending toward the substrate and at least partially covering both sidewalls of the gate electrode, and
the gate spacer structures and the gate capping pattern are formed of different materials from each other.

2. The device of claim 1, further comprising:
a gate dielectric layer interposed between the gate electrode and the substrate; and
epitaxial patterns provided on the active pattern at both sides of the gate electrode.

3. The device of claim 2, further comprising:
contact plugs provided on the substrate at both sides of the gate electrode and connected to the epitaxial patterns, respectively,
wherein each of the contact plugs contacts at least a portion of the gate capping pattern.

4. The device of claim 2, further comprising:
an active fin extending upward from a top surface of the active pattern,
wherein the gate electrode is disposed to cross the active fin, and
the gate dielectric layer is disposed to extend along a bottom surface of the gate electrode and cover top and side surfaces of the active fin.

5. The device of claim 4, wherein the active fin is provided between the epitaxial patterns and below the gate electrode, and
wherein the gate electrode comprises first portions facing both sidewalls of the active fin and a second portion provided on the active fin to connect the first portions to each other.

6. The device of claim 1, wherein the gate capping pattern includes a seam formed at an upper portion thereof.

7. The device of claim 1, wherein the width of the gate capping pattern increases in a direction away from the substrate.

8. The device of claim 7, wherein at least one of the extended portions has a bottom surface that is in direct contact with a top surface of the substrate.

9. The device of claim 1,
wherein the extended portions of the gate capping pattern cover top surfaces of the gate spacer structures, respectively, and the top surfaces of the gate spacer structures are at a lower level than a top surface of the gate electrode.

10. The device of claim 1, wherein the gate capping pattern has a relatively higher dielectric constant than the insulating layer.

11. The device of claim 1, further comprising:
first and second contact plugs penetrating the insulating layer respectively at two sides of the gate electrodes, the first contact plug being in contact with at least a portion of the gate capping pattern and penetrating the insulating layer along a contour of the gate capping pattern, the second contact plug laterally spaced apart from the gate capping pattern and penetrating through the insulating layer.

12. A semiconductor device, comprising:
a conductive pattern on a substrate;
an interlayered insulating layer surrounding the conductive pattern; and
a capping pattern on the conductive pattern,
wherein the capping pattern comprises extended portions extending toward the substrate and covering both sidewalls of the conductive pattern,
the capping pattern is in contact with the interlayered insulating layer, and
the capping pattern has a width monotonously increasing in a direction away from the substrate such that the width of the capping pattern at a top thereof is wider than the width of the capping pattern at an interface between the conductive pattern and the capping pattern.

13. The semiconductor device of claim 12, wherein the capping pattern directly cover both sidewalls of the conductive pattern.

14. A semiconductor device, comprising:
a substrate including an active pattern;
a gate electrode crossing the active pattern;
spacer structures on two opposite sidewalls of the gate electrode; and
a gate capping pattern on the gate electrode,
wherein the gate capping pattern has an upper surface that is substantially flat and a width of the gate capping pattern is larger than that of the gate electrode,
the gate capping pattern at least partially covers the two sidewalls of the gate electrode,
the gate capping pattern covers top surfaces of the spacer structures, and interfaces between the gate capping pattern and the spacer structures are at a lower level than a top surface of the gate electrode, and
the spacer structures and the gate capping pattern are formed of different materials from each other.

15. The device of claim 14, wherein the width of the gate capping pattern increases in a direction away from the substrate.

16. The device of claim 14, further comprising:
a gate dielectric layer interposed between the gate electrode and the substrate.

17. The device of claim 16, further comprising:
epitaxial patterns on the active pattern at both sides of the gate electrode, respectively.

18. The device of claim 17, further comprising:
contact plugs on the substrate at both sides of the gate electrode respectively, the contact plugs connected to the epitaxial patterns, respectively,
wherein at least one of the contact plugs contacts at least a portion of the gate capping pattern.

19. The device of claim 14, wherein the gate capping pattern includes a seam at an upper portion thereof.

20. The semiconductor device of claim 14, wherein the gate capping pattern at least partially directly covers the two sidewalls of the gate electrode.

* * * * *